(12) United States Patent
Kim

(10) Patent No.: US 9,794,460 B1
(45) Date of Patent: Oct. 17, 2017

(54) IMAGE SENSOR HAVING LIGHT FIELD MODE AND CONVENTIONAL MODE

(71) Applicant: SK hynix Inc., Gyeonggi-do (KR)

(72) Inventor: Jong Eun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/238,515

(22) Filed: Aug. 16, 2016

(30) Foreign Application Priority Data

Apr. 15, 2016 (KR) .......................... 10-2016-0046239

(51) Int. Cl.
*H04N 5/225* (2006.01)

(52) U.S. Cl.
CPC ......... *H04N 5/2254* (2013.01); *H04N 5/2252* (2013.01); *H04N 5/2253* (2013.01); *H04N 5/2257* (2013.01)

(58) Field of Classification Search
CPC .. H04N 5/2254; H04N 5/2252; H04N 5/2253; H04N 5/2257
See application file for complete search history.

(56) References Cited

U.S. PATENT DOCUMENTS

| | | | |
|---|---|---|---|
| 2010/0066812 A1* | 3/2010 | Kajihara | G03B 15/00 348/46 |
| 2013/0076930 A1 | 3/2013 | Border et al. | |
| 2013/0258217 A1* | 10/2013 | Azuma | G02B 27/2214 349/15 |
| 2015/0070474 A1 | 3/2015 | Bhat et al. | |

FOREIGN PATENT DOCUMENTS

KR    1020170073910    6/2017

* cited by examiner

*Primary Examiner* — Tuan Ho
(74) *Attorney, Agent, or Firm* — IP & T Group LLP

(57) ABSTRACT

Provided is an image sensor. The image sensor may include a plurality of first lenses disposed on a substrate, and a plurality of second lenses disposed on a structure disposed on the substrate suitable for changing the distance between the first and second lenses from a first minimum distance wherein the image sensor operates in a first mode to a second maximum distance wherein the image sensor operates in a second mode.

20 Claims, 35 Drawing Sheets

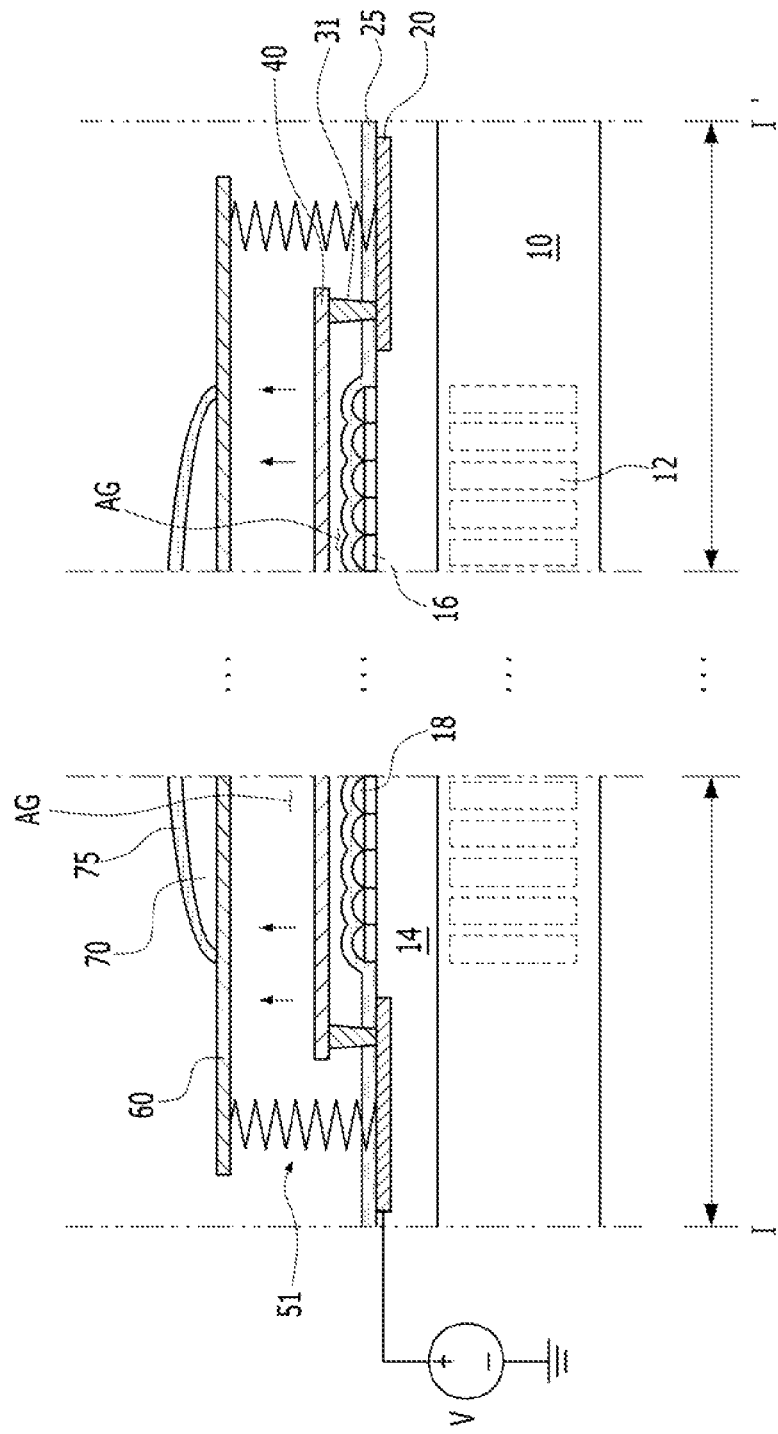

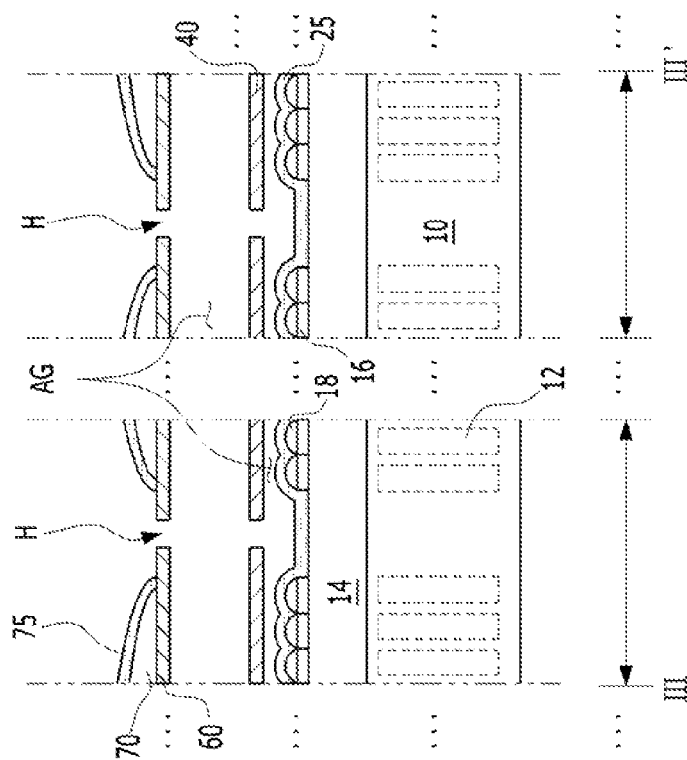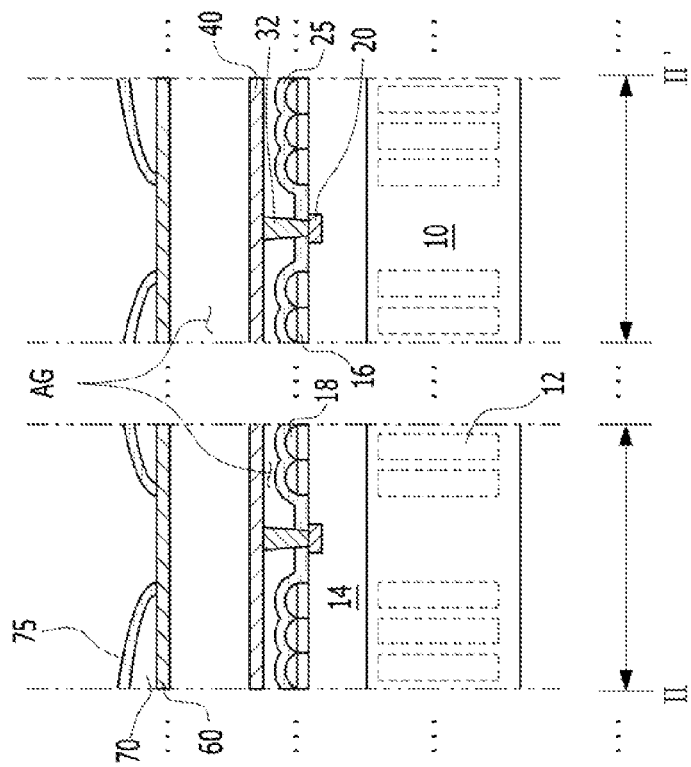

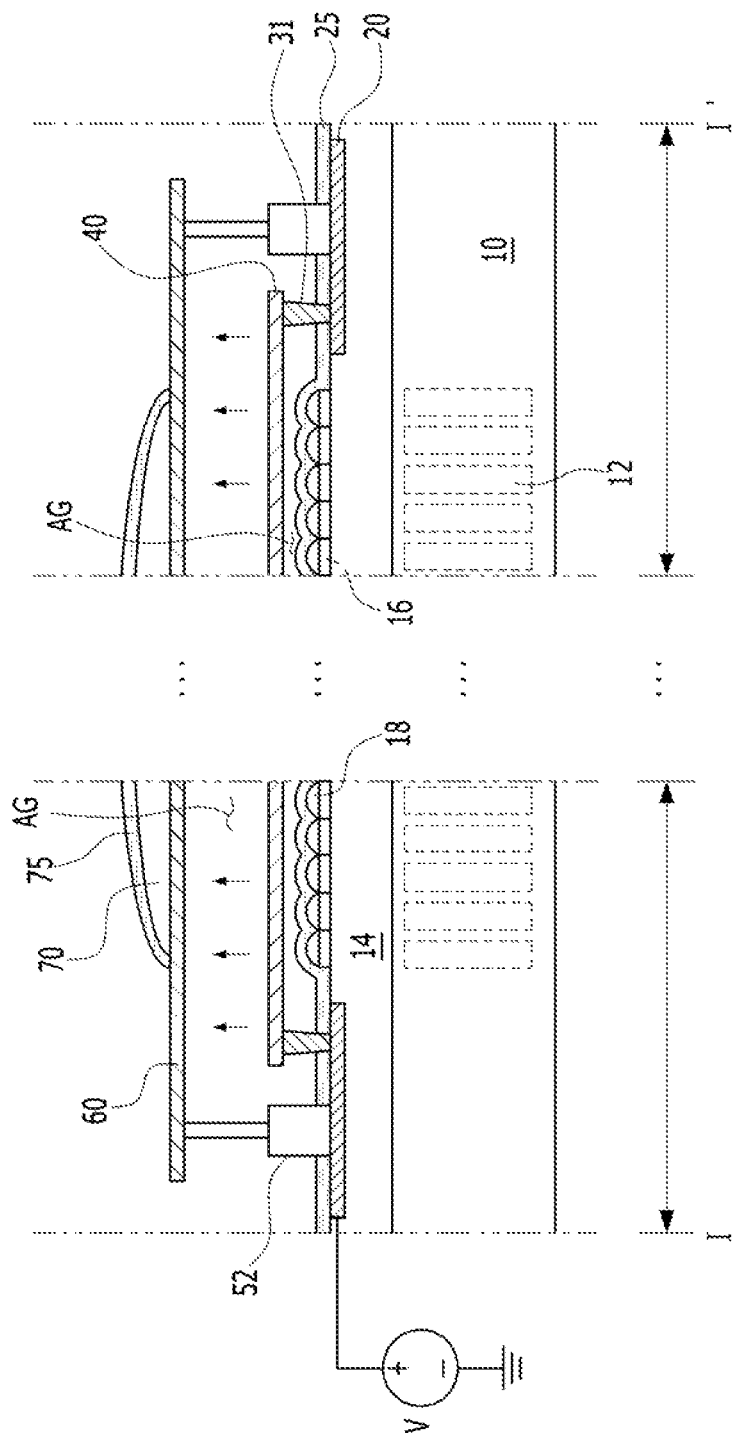

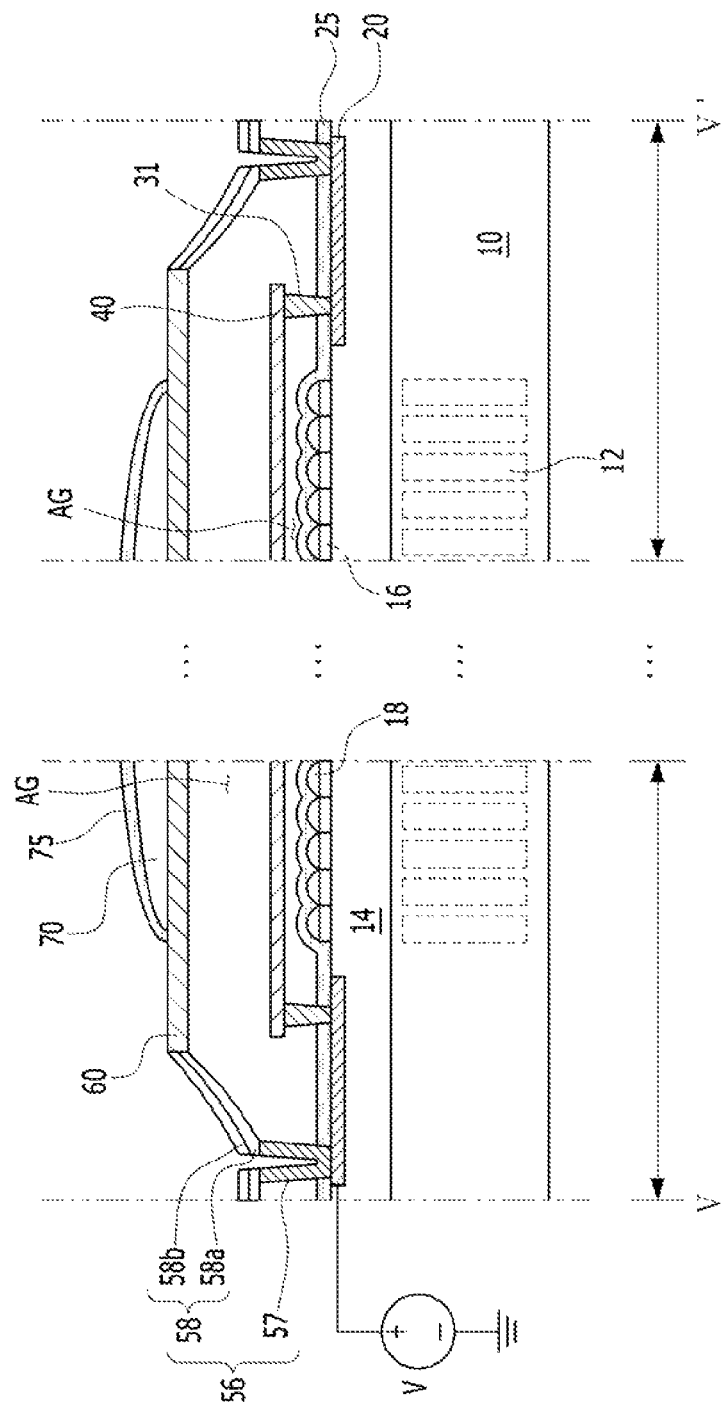

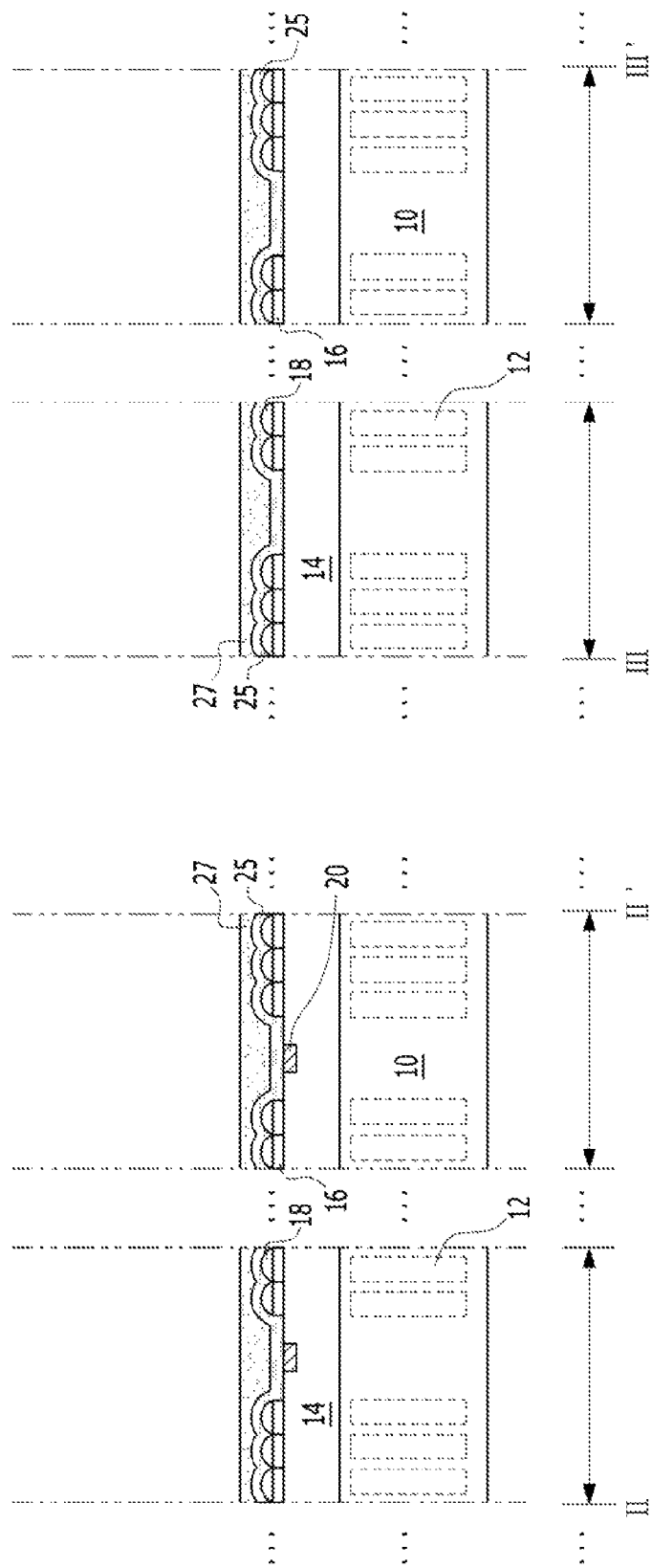

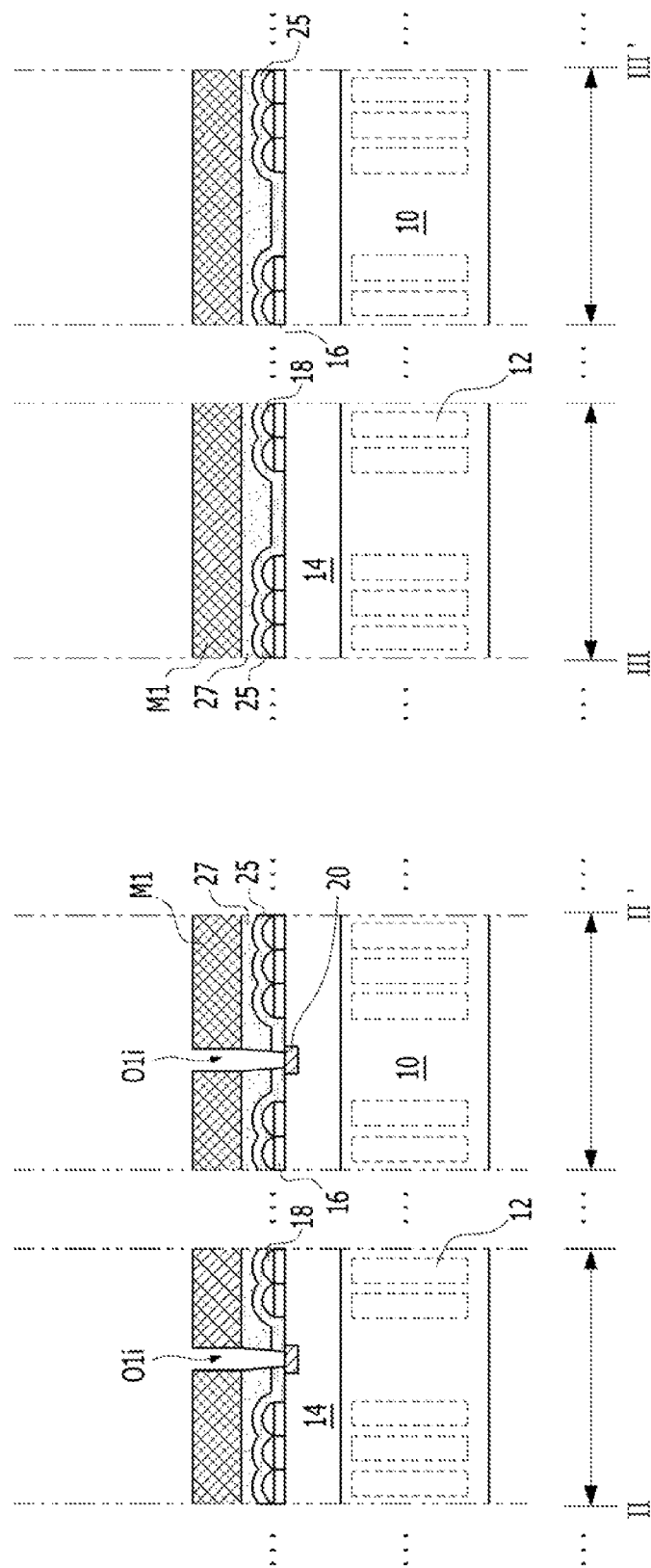

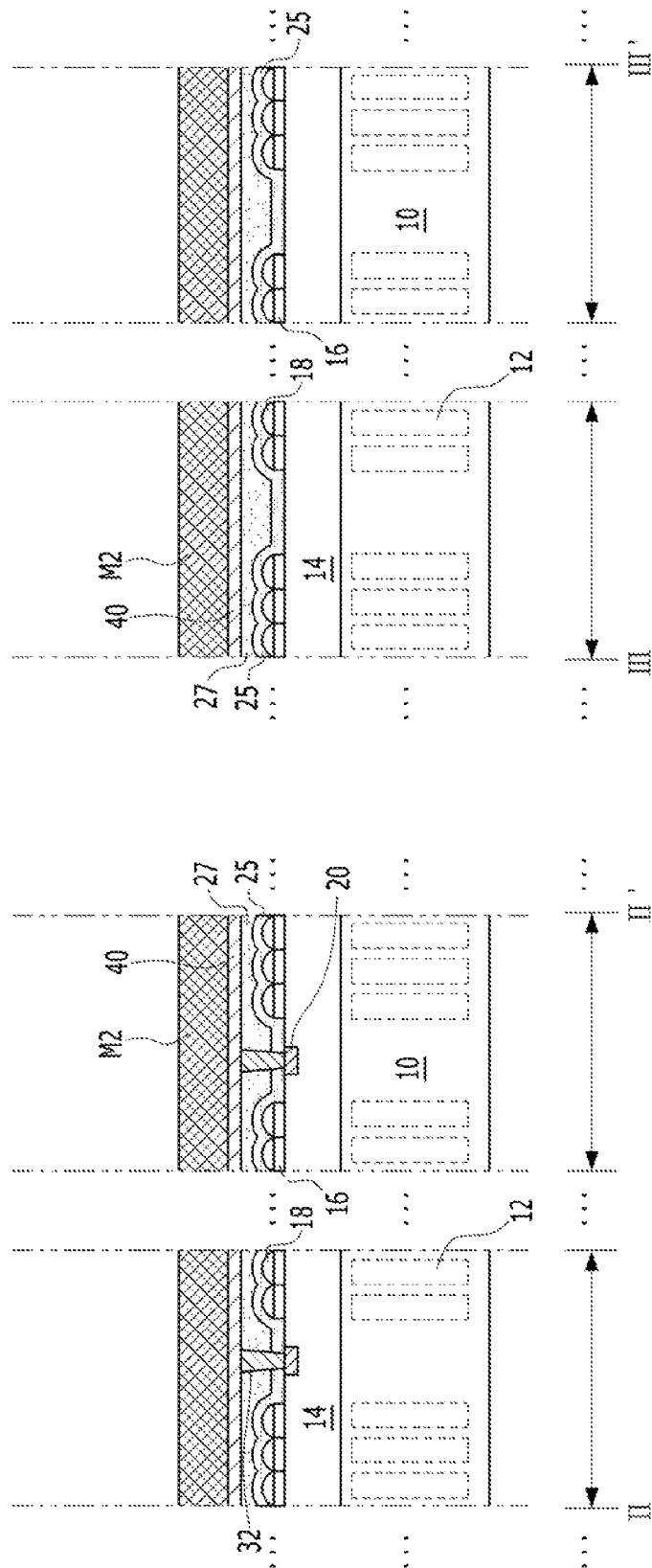

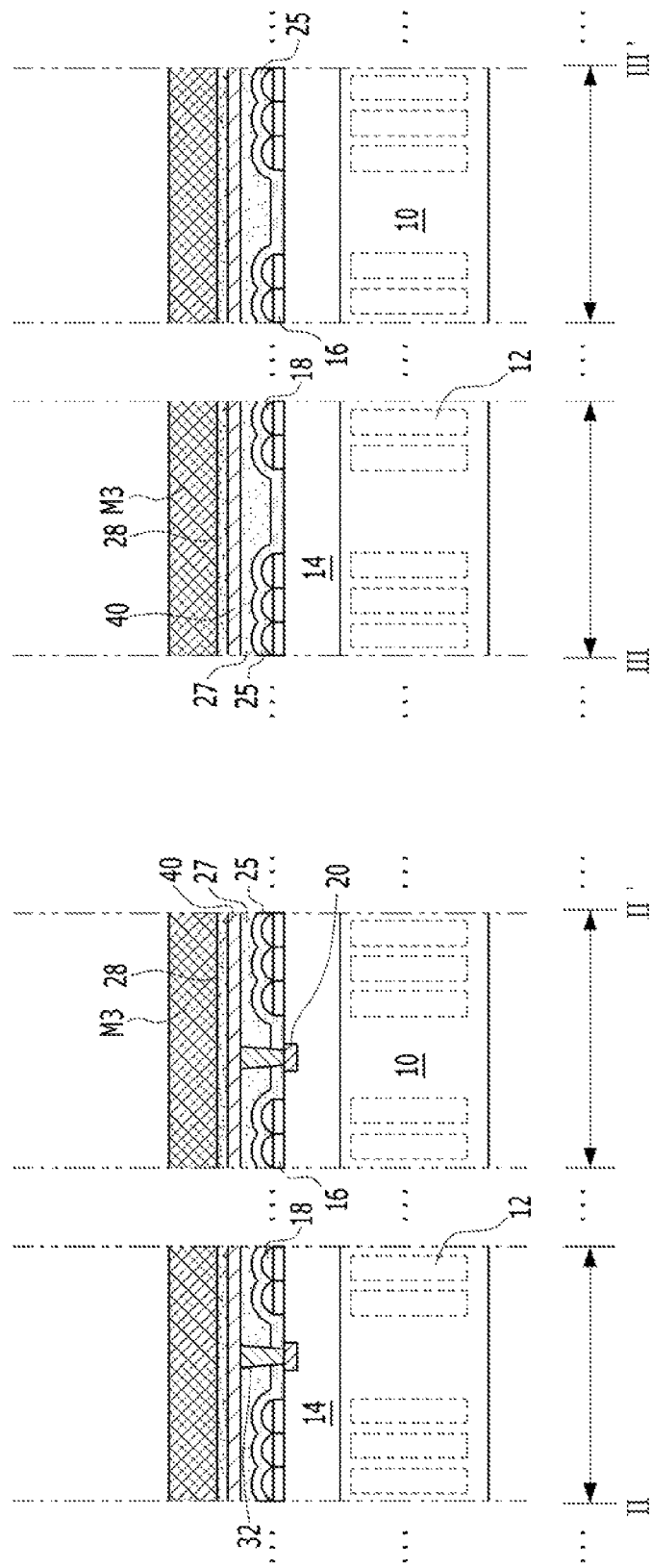

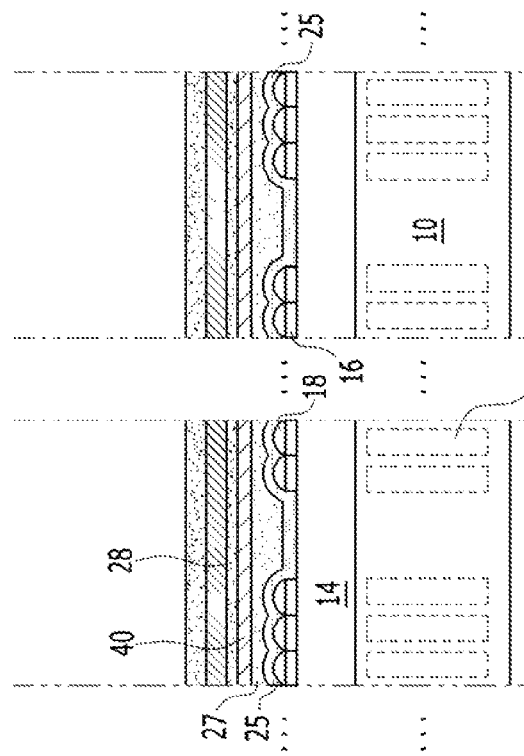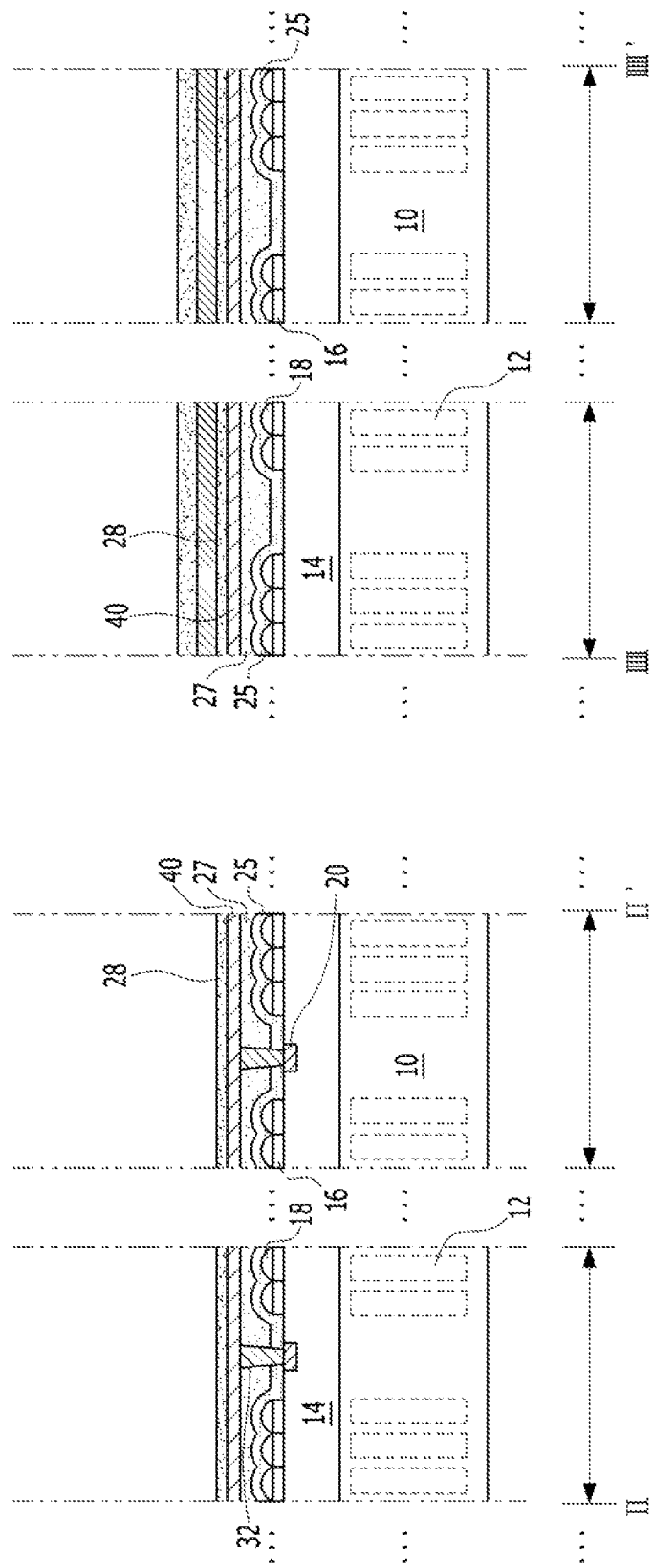

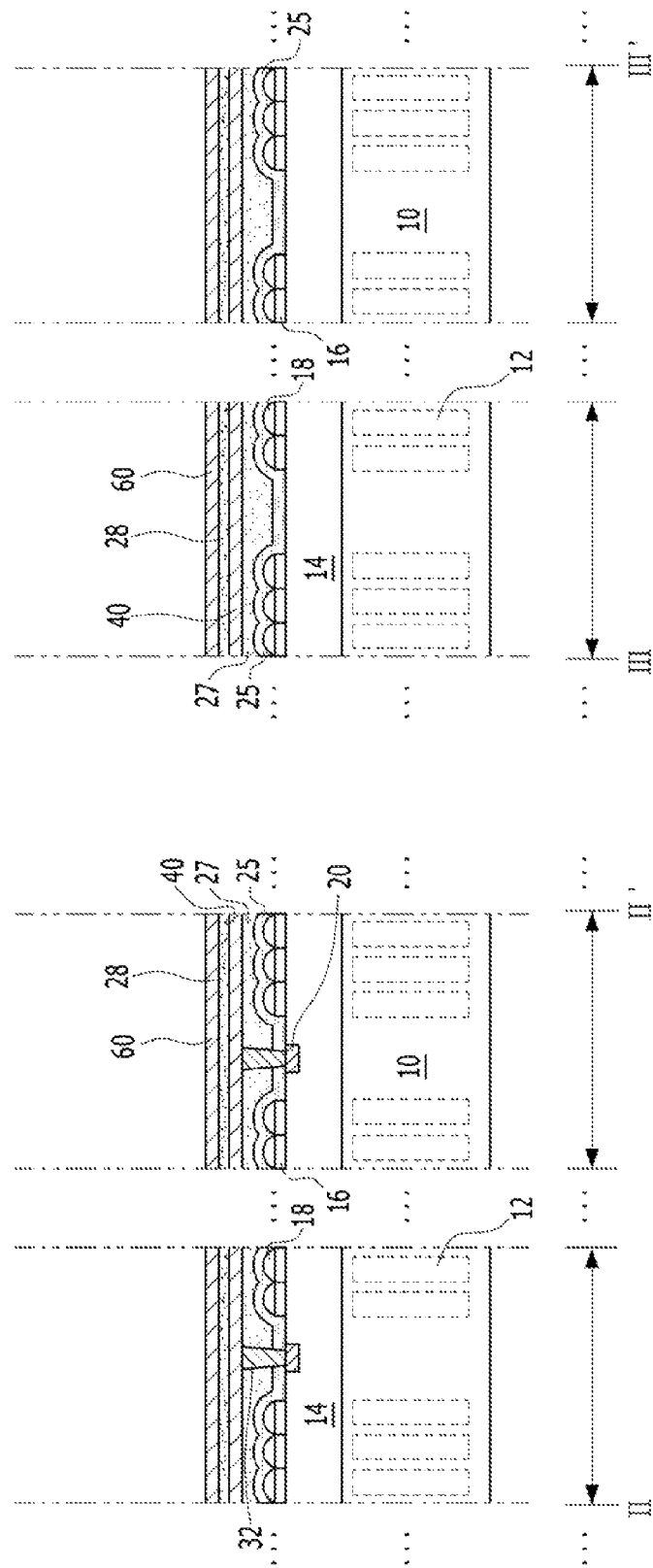

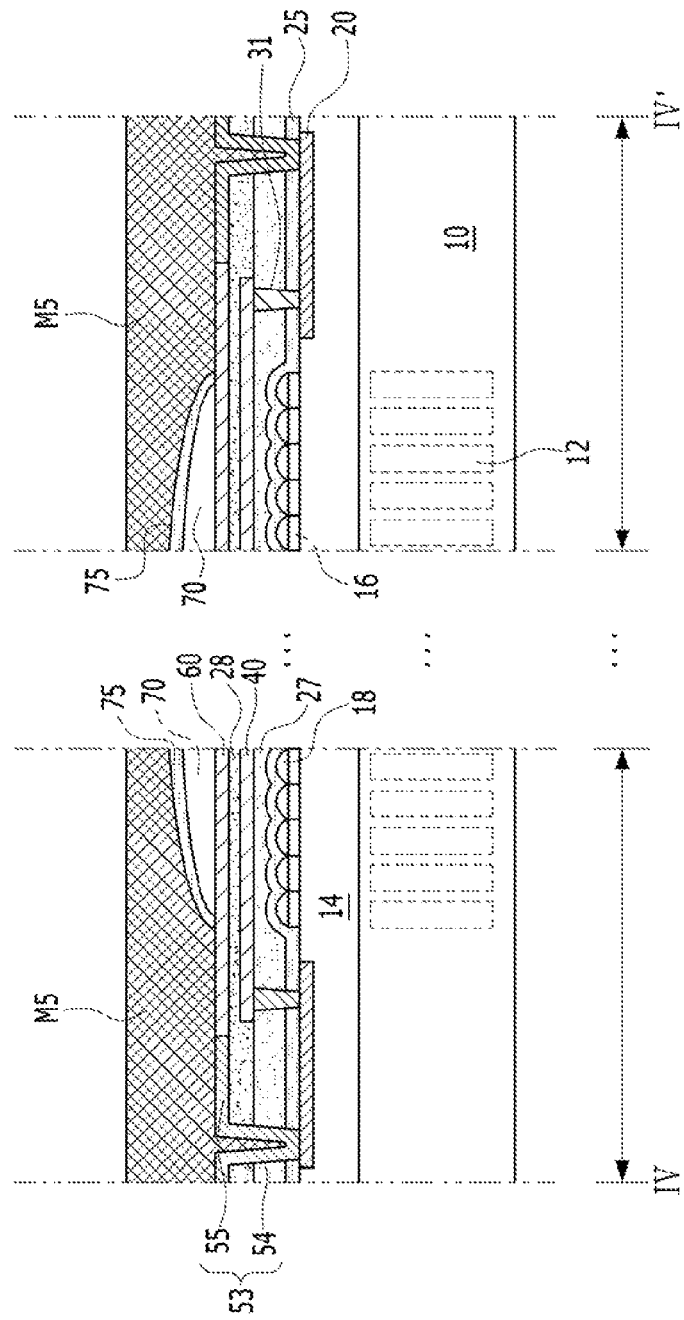

IMAGE SENSOR HAVING LIGHT FIELD MODE AND CONVENTIONAL MODE

CROSS-REFERENCE TO RELATED APPLICATION

The present application claims priority under 35 U.S.C. 119(a) to Korean Patent Application No. 10-2016-0046239, filed on Apr. 15, 2016, which is herein incorporated by reference in its entirety.

BACKGROUND

1. Field

Exemplary embodiments of the present invention relate generally to an image sensor and, more particularly, to an image sensor that is operable in both a light field mode and a conventional mode.

2. Description of the Related Art

Generally, substantial research and development efforts in the field of image sensors and digital cameras are directed to achieving higher image resolution. Recently, an image sensor or light field camera capable of operating in a light field mode for photography has been developed. Light field mode involves photographing an entire area to where light is incident and obtaining an image by adjusting the focus of the image sensor. Light field mode is a technology which could be adopted to implement various functions of an image sensor or a digital camera.

SUMMARY

Various embodiments of the present invention provide an image sensor that is operable in both a light field mode and a conventional mode.

The present invention is also directed to a method for fabricating an image sensor that can operate in both a light field mode and a conventional mode.

The technical objectives of the inventive concepts are not limited to the above mentioned objectives, and those skilled in the art to which the inventive concepts pertains may evidently understand other objects from the following description.

In accordance with an aspect of the inventive concepts, an image sensor may include a plurality of first lenses disposed on a substrate, and a plurality of second lenses disposed on a structure disposed on the substrate suitable for changing the distance between the first and second lenses from a first minimum distance wherein the image sensor operates in a first mode to a second maximum distance wherein the image sensor operates in a second mode.

The structure may further include a support plate, the upper and lower electrode plates are coupled to the support plate via an upper and a lower electrode post, respectively, the upper electrode plate is configured to move upward and downward by the upper electrode post, and each of the second lenses has a greater diameter than each of the first lenses.

The image sensor may further include the substrate may include a pixel area and a peripheral area surrounding the pixel area. The first and second lenses may be disposed within the pixel area. The upper electrode post may be disposed within the peripheral area.

The lower electrode posts may include an inner lower electrode post disposed in the pixel area and an outer lower electrode post disposed in the peripheral area.

An air gap may exist between the first lenses and the lower electrode plate, and between the lower electrode plate and the upper electrode plate.

The upper electrode post may include MEMS springs.

Each of the upper electrode posts may include a fixed supporting post and a supporting arm.

The supporting arm may have flexibility and a force of restoration.

The supporting arm may include bi-metal.

The supporting arm may include a bi-morph piezoelectric device.

In accordance with an aspect of the inventive concepts, an image sensor may include a substrate having a pixel area and a peripheral area surrounding the pixel area, color filters and microlenses disposed on the substrate corresponding to the pixel area, a supporting plate disposed on the substrate corresponding to the peripheral area, lower electrode posts and upper electrode posts disposed on the supporting plate, a lower electrode plate horizontally disposed on the lower electrode posts, an upper electrode plate horizontally disposed on the upper electrode posts, and light field lenses disposed on the upper electrode plate. The upper electrode plate may be suitable for moving so that an interval between the lower electrode plate and the upper electrode plate may be changed.

The supporting plate may be disposed in the pixel area, and the supporting plate may have a frame shape in the peripheral area and may have a mesh shape in the pixel area.

The supporting plate may include slits.

The lower electrode plate and the upper electrode plate may include a transparent conductor.

The image sensor may further include a transparent first protection layer on the microlenses, and a transparent second protection layer on the light field lenses.

In accordance with an aspect of the inventive concepts, an image sensor may include a substrate having a pixel area and a peripheral area surrounding the pixel area, first lenses disposed in the pixel area of the substrate, a supporting plate disposed to have a frame shape in the peripheral area of the substrate and to have a mesh shape in the pixel area, lower electrode posts disposed in the peripheral area and on the supporting plate in the pixel area, a lower electrode plate horizontally disposed on the first lenses and the lower electrode posts, upper electrode posts disposed on the supporting plate in the peripheral area, an upper electrode plate horizontally disposed on the lower electrode plate and the upper electrode posts, and second lenses disposed on the upper electrode plate. An air gap may exist between the first lenses and the lower electrode plate and between the lower electrode plate and the upper electrode plate.

The image sensor may further include holes selectively disposed at locations each corresponding to a boundary portion of the four second lenses within the pixel area.

The lower electrode posts may include inner lower electrode posts each selectively formed at a location corresponding to a boundary portion of the four light field lenses within the pixel area.

The holes and the inner lower electrode posts may be disposed in such a way as to alternate.

The supporting plate, the lower electrode posts, the lower electrode plate, the upper electrode posts, and the upper electrode plate may include a conductor.

The details of other embodiments are included in the detailed description and the drawings.

BRIEF DESCRIPTION OF THE DRAWINGS

The foregoing and other features and advantages of the present invention will become apparent from the following more detailed description of embodiments of the present invention in reference to the accompanying drawings in which:

FIGS. 3A and 4A are schematic longitudinal sectional views of the image sensor taken along line I-I' of FIG. 2;

FIGS. 3B, and 4B, are schematic longitudinal sectional views of the pixel area of the image sensor taken along line II-II' of FIG. 2;

FIGS. 3C and 4C are schematic longitudinal sectional views of the pixel area of the image sensor taken along line III-III' of FIG. 2;

FIGS. 5A and 5B are schematic longitudinal sectional views of the image sensor taken along line I-I' of FIG. 2;

FIGS. 9A and 9B are schematic longitudinal sectional views of the image sensor taken along line IV-IV' of FIG. 6;

FIGS. 10A to 19C are schematic longitudinal sectional views of the image sensor taken along line IV-IV' of FIG. 6 and taken along line II-II' and line III-III' of FIG. 2 for describing a method for forming the image sensor in accordance with an embodiment of the present invention.

DETAILED DESCRIPTION

Figure 1:
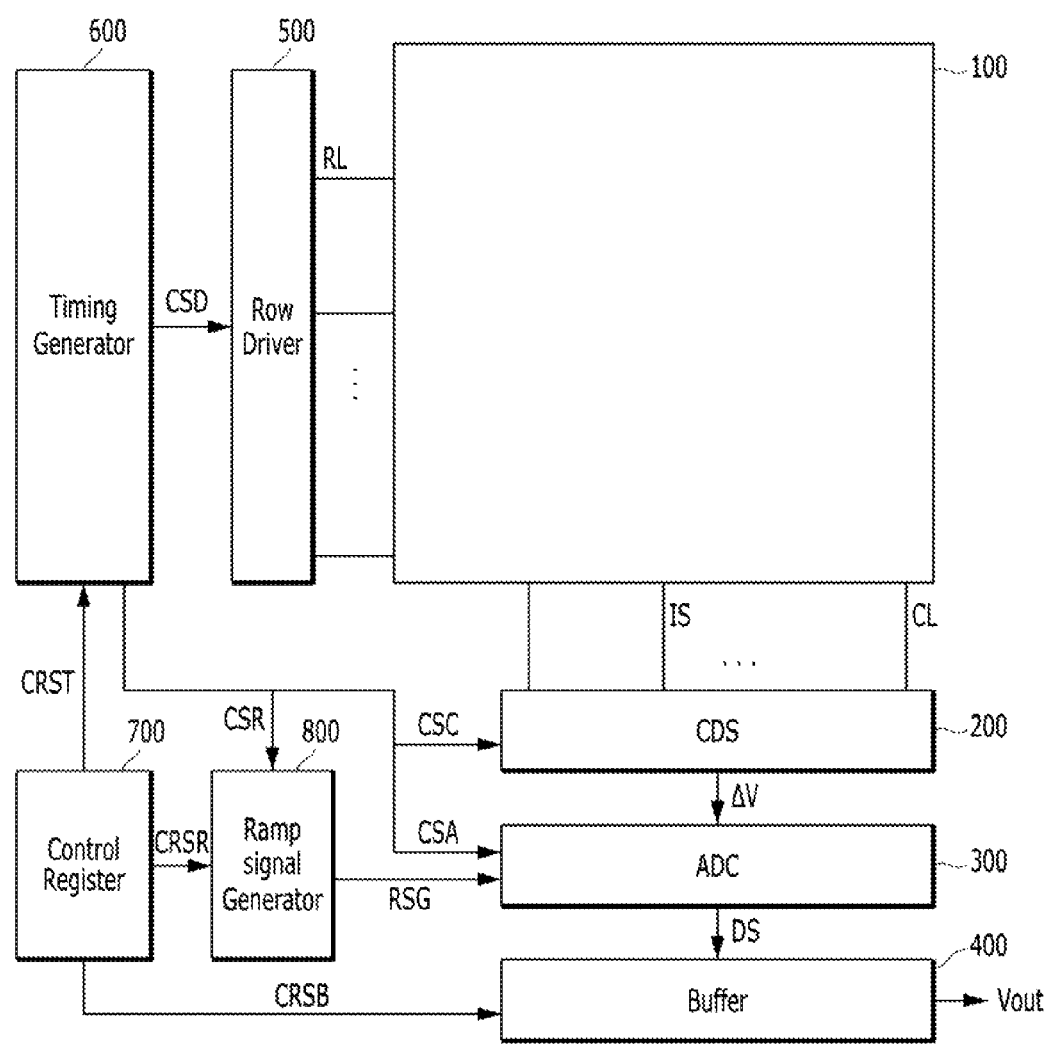
FIG. 1 is a block diagram schematically illustrating an image sensor in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the present invention to those skilled in the art.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

Terms used in the specification are provided to describe the embodiments and are not intended to limit the present invention. In the specification, the singular form, unless specially described otherwise, may include the plural form. Furthermore, terms, such as "comprises" and/or "comprising" used in the specification, do not exclude the existence or addition of one or more elements, steps, operations and/or devices in the described elements, steps, operations and/or devices.

When it is described that one element is "connected to" or "coupled" to" the other element, it means that the one element may be directly connected or coupled to the other element or a third element may be interposed between the two elements. In contrast, when it is described that one element is "directly connected to" or "directly coupled" to" the other element, it means that a third element is not interposed between the two elements. The term "and/or" includes a combination of respective described items and all of combinations of one or more of the items.

Spatially relative terms, such as "below", "beneath", "lower", "above", and "upper", may be used to easily describe the correlations between one element or elements and the other element or other elements as illustrated in the drawings. The spatially relative term should be understood as encompassing different directions of an element in use or operation in addition to the direction depicted in the drawing. For example, if the element in the drawing is turned over, one element described as being "below" or "beneath" the other element would then be placed "above" the other element.

Furthermore, the embodiments described in this specification may be described with reference to cross-sectional views and/or plane views, that is, with various diagrams of the present invention. In the drawings, the thickness of films and areas has been enlarged to effectively describe technical contents. Accordingly, forms of the various diagrams may be changed by a manufacturing technology and/or tolerance. Thus, the embodiments of the present invention are not limited to the illustrated specific forms, but may include, for example, a change in a form generated according to a manufacturing process. For example, an area illustrated as being a right angle may be a rounded form or a form having specific curvature. Accordingly, areas illustrated in the drawings have approximate attributes, and the forms of the illustrated areas are provided to illustrate specific forms of the areas of a device and are not intended to limit the scope of the present invention.

Throughout the specification, the same reference numerals denote the same elements. Accordingly, the same reference numerals or similar reference numerals may be described with reference to other drawings although they are mentioned or described in corresponding drawings. Furthermore, although reference numerals are not shown, they may be described with reference to other drawings.

FIG. 1 is a block diagram schematically showing an image sensor generally designated with numeral 10, in accordance with an embodiment of the present invention. Referring to FIG. 1, the image sensor may include a pixel array 100 in which a plurality of pixel groups has been arranged in a matrix form, a correlated double sampler (CDS) 200, an analog-digital converter (ADC) 300, a buffer 400, a row driver 500, a timing generator 600, a control register 700, and a ramp signal generator 800.

The pixel array 100 may include a plurality of pixels arranged in rows and columns in a matrix form. Each of the plurality of pixels may convert optical image information into an electrical image signal and send it to the CDS 200 through a column line CL. A plurality of the pixels may be coupled to each one of the row lines RL. Also, a plurality of the pixels may be coupled to each one of the column lines CL.

The CDS 200 may hold and sample an electrical image signal IS received from the pixel array 100 via the column lines. For example, the CDS 200 may sample a reference voltage level and the voltage level of the received electrical image signal in response to a clock signal CSC provided by the timing generator 600. The CDS 200 may send a value ΔV corresponding to a difference between the reference voltage level and the voltage level of the received electrical image signal to the ADC 300.

The ADC 300 may convert a received analog signal of the ΔV value from the CDS into a digital signal DS and send the digital signal DS to the buffer 400.

The buffer 400 may latch received digital signals and sequentially output the latched signals to a signal processing unit (not shown). The buffer 400 may include a memory configured to latch digital signals and a sense amplifier configured to amplify the digital signals.

The row driver 500 may drive the plurality of pixels of the pixel array 100 in response to a timing signal CSD from the timing generator 600. For example, the row driver 500 may generate driving signals for selecting and driving one of the plurality of row lines RL.

The timing generator 600 may generate timing signals CSC, CSA, CSD, and CSR for controlling the CDS 200, the ADC 300, the row driver 500, and the ramp signal generator 800, respectively.

The control register 700 may generate control signals CRSB, CRST and CRSR for controlling the buffer 400, the timing generator 600, and the ramp signal generator 800, respectively.

The ramp signal generator 800 may generate a ramp signal RSG for controlling an image signal output by the buffer 400 under the control of the timing generator 600.

Figure 2:
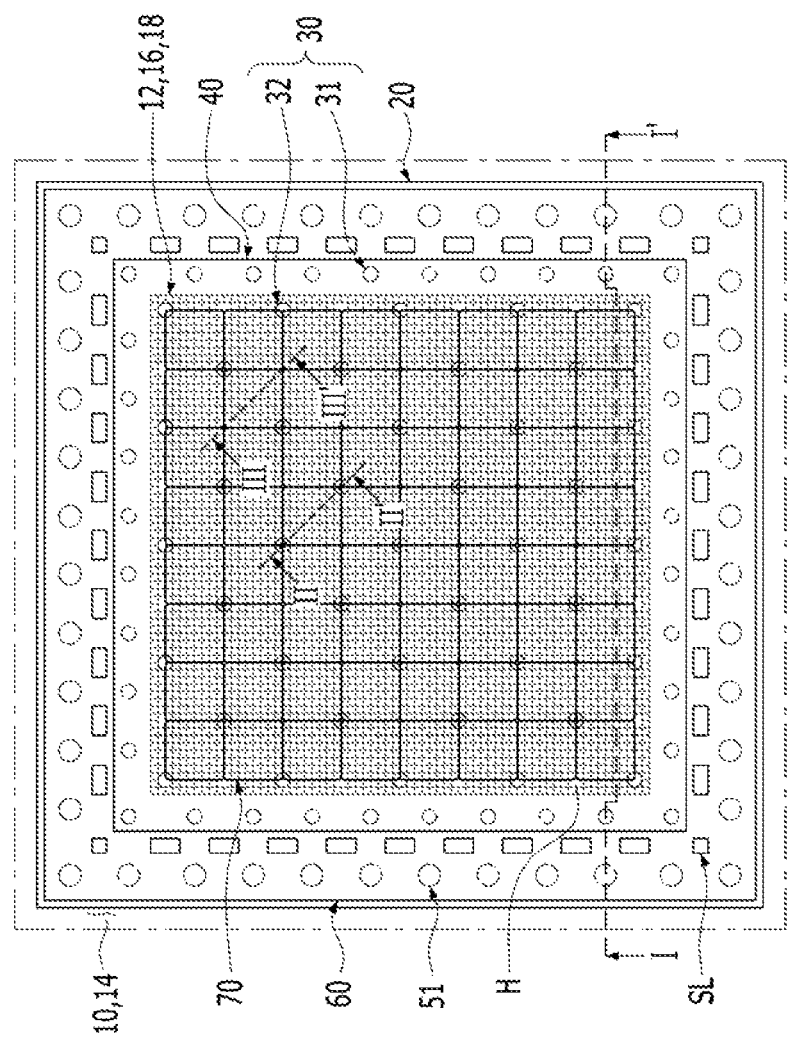
FIG. 2 is a layout diagram schematically illustrating an image sensor in accordance with an embodiment of the present invention.
Figure 3A:
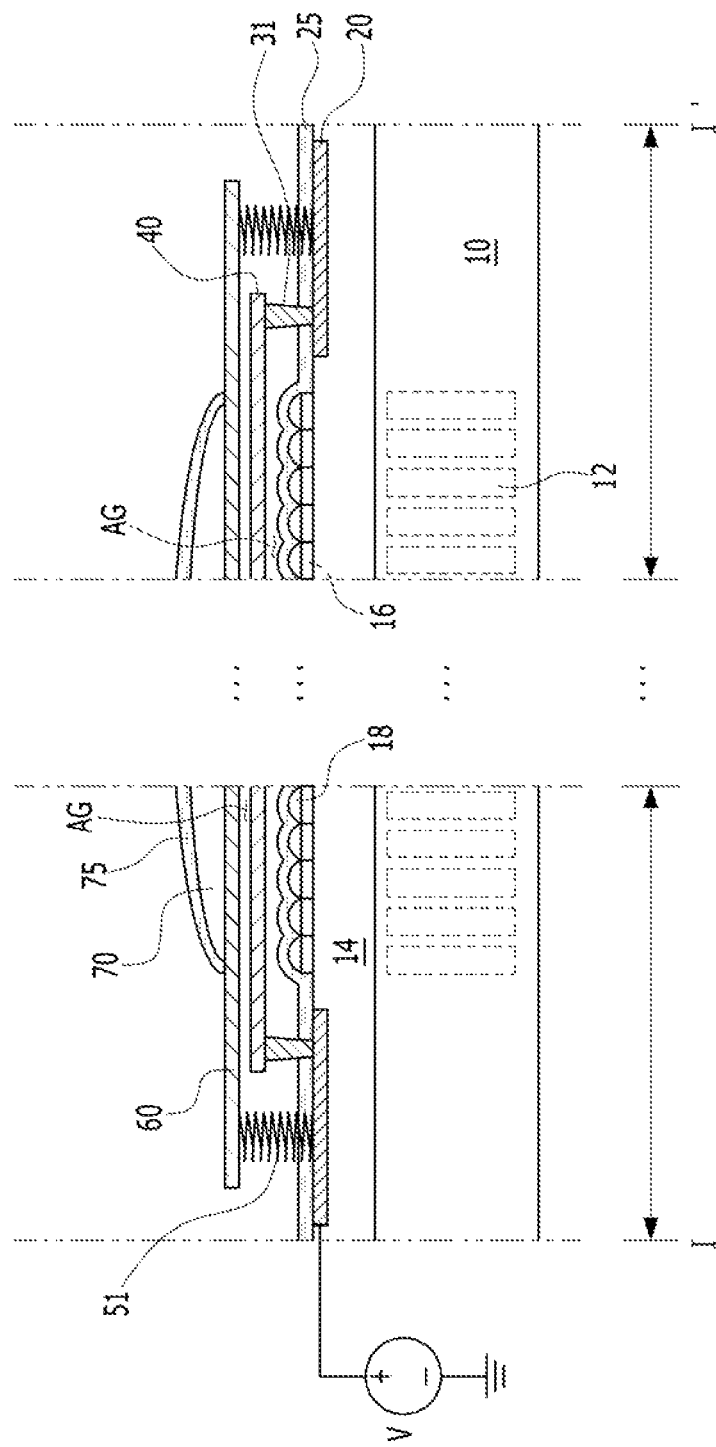

FIG. 2 is a layout diagram schematically showing an image sensor in accordance with an embodiment of the present invention. FIGS. 3A and 4A are schematic longitudinal sectional views of the image sensor taken along line I-I' of FIG. 2, and FIGS. 3B, 3C, 4B, and 4C are schematic longitudinal sectional views of the pixel area of the image sensor taken along line II-II' and III-III'.

Figure 3B:
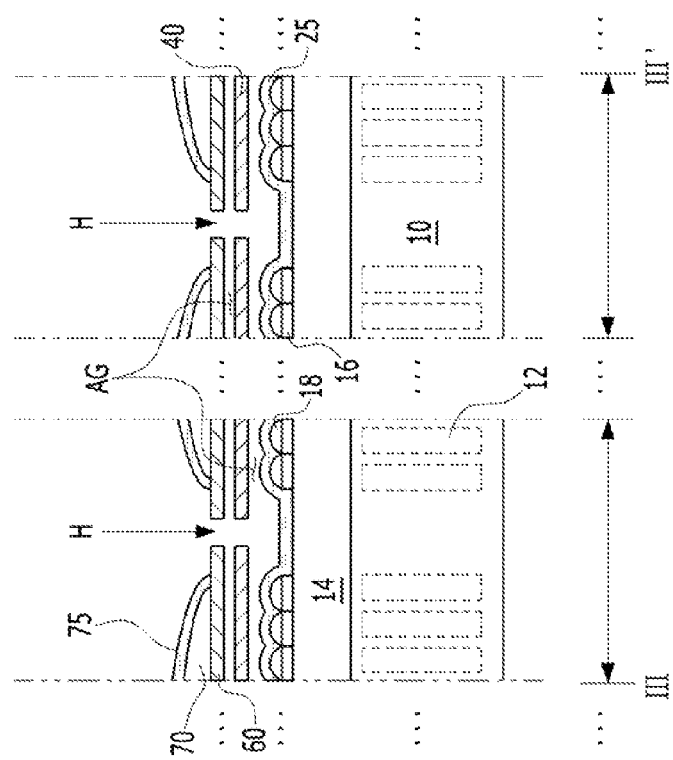
Figure 3C:
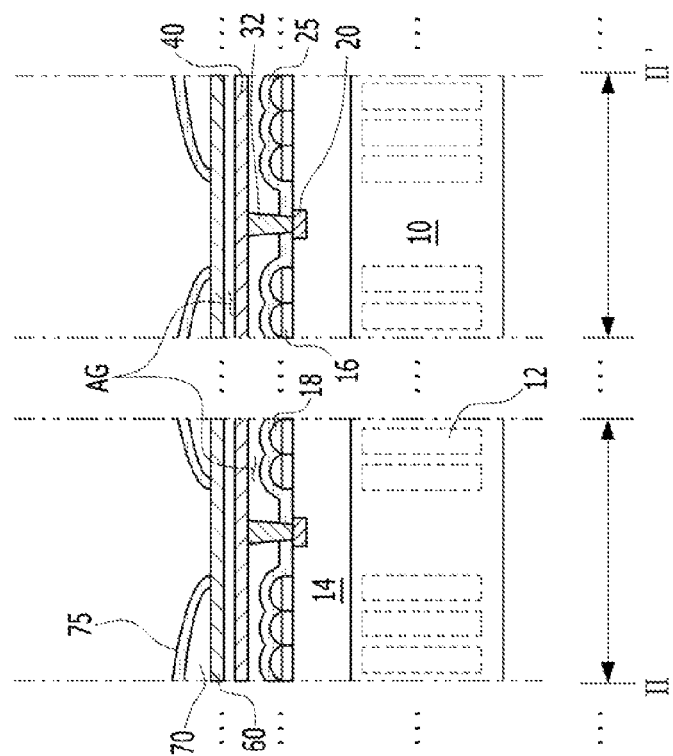

Referring to FIGS. 2, 3A to 3C and 4A to 4C, the image sensor, in accordance with an embodiment of the present invention, may include a middle layer 14, color filters 16, microlenses 18, a supporting plate 20, lower electrode posts 30, a lower electrode plate 40, upper electrode posts 51, an upper electrode plate 60, and light field lenses 70 on a substrate 10. The supporting plate 20 and the upper electrode plate 60 may be electrically connected to a power source V. An air gap AG may exist between the microlenses 18 and the lower electrode plate 40. An air gap AG may also exist between the lower electrode plate 40 and the upper electrode plate 60. A hole H may exist in the boundary portion of the four light field lenses 70 within the pixel area. More specifically, the color filter 16 and the microlens 18 may not be formed in locations corresponding to the boundary portion of the four light field lenses 70. Hence, as illustrated in FIG. 3C a lower lens protection layer 25 may directly contact the middle layer 14 in an area below the hole H.

The substrate 10 may be or include at least one of a silicon wafer, a silicon on insulator (SOI) wafer, and an epitaxial growth layer. The substrate 10 may include a plurality of photodiodes 12 formed under a plurality of corresponding microlenses 18. More specifically, as shown in FIGS. 3B and 3C each photodiode 12 is aligned with a corresponding microlens 18 in a direction perpendicular to the plane of the substrate 10.

The middle layer 14 may include one or more insulating layers. For example, the middle layer 14 may include at least one of a silicon oxide layer, a silicon nitride layer and/or a polyimide layer.

Each of the color filters 16 may selectively transmit one of green, red, and blue light. In some embodiments of the present invention, each of the color filters 16 may selectively transmit two of green, red, and blue light.

Each of the microlenses 18 may be disposed directly on a respective color filter 16. Each of the microlenses 18 serves to focus the incident light to a corresponding photodiode 12. Each of the microlenses 18 may include a transparent organic material.

For example, the substrate 10 may include the pixel area in which the photodiodes 12, the color filters 16, and the microlenses 18 have been formed and a peripheral area in which the upper electrode posts 51 have been formed. The peripheral area may surround the pixel area.

The supporting plate 20 may be directly formed on the middle layer 14 as illustrated in FIG. 4A. In another embodiment, (not shown), the supporting plate 20 may be buried within the middle layer 14. The supporting plate 20 may support the lower electrode posts 30 (31 and 32) and the upper electrode posts 51. The supporting plate 20 may deliver a voltage and/or current from the power source V to the lower electrode plate 40 and the upper electrode plate 60. For example, the supporting plate 20 may be made of or include a metal. The supporting plate 20 may include a plurality of slits SL (not shown) in order to flexibly respond to thermal expansion. That is, the supporting plate 20 may have a frame shape within the peripheral area and have a mesh shape within the pixel area.

The lower electrode posts 30 (31, 32) may support the lower electrode plate 40 physically and mechanically. Each of the lower electrode posts 30 (31, 32) may, for example, have a pillar or post shape having a wider upper portion and a narrower lower portion. The lower electrode post 30 may be made or include a conductor material, such as, for example, a metal.

The lower electrode post 30 (31, 32) may electrically connect the supporting plate 20 to the lower electrode plate 40. Each of the lower electrode posts 30 may include an outer lower electrode post 31 and an inner lower electrode post 32. The outer lower electrode posts 31 may be disposed in the peripheral area, that is, in the outer periphery of an area in which the color filters 16, the microlenses 18 or the light field lenses 70 have been formed. The inner lower electrode posts 32 may be disposed in the pixel area, that is, within an area in which the color filters 16, the microlenses 18, or the light field lenses 70 have been formed. More specifically, each of the inner lower electrode posts 32 may be selectively disposed within an area that is, the hole H corresponding to the boundary portion of the four light field lenses 70. The inner lower electrode posts 32 have been illustrated as being disposed within the holes H, for example, every other point vertically and horizontally so that they alternate.

The lower electrode plate 40 may be supported by the lower electrode posts 30 so that it is horizontally disposed above the microlenses 18. The lower electrode plate 40 may be made of or include at least one of indium-tin oxide (ITO), indium-zinc oxide (IZO), zinc oxide (ZnO), and other transparent conductive materials. The lower electrode plate 40 may be fixed. The lower electrode plate 40 may not allow up and down movement.

The upper electrode posts 51 may be disposed only within the peripheral area. The upper electrode posts 51 may support the upper electrode plate 60 physically and mechanically. The upper electrode post 51 may include a spring, for example, a micro-electro-mechanical system (MEMS) spring, such as a tension spring. The upper electrode post 51 may be made of or include a metal. Accordingly, the upper electrode post 51 may electrically connect the supporting plate 20 to the upper electrode plate 60.

The upper electrode plate 60 may be supported by the upper electrode posts 51 so that it is horizontally disposed above the lower electrode plate 40. Like the lower electrode plate 40, the upper electrode plate 60 may include at least one of ITO, IZO, ZnO, and other transparent conductive materials. The upper electrode plate 60 may be configured to move upwardly and downwardly. For example, the distance or interval between the lower electrode plate 40 and the upper electrode plate 60 may be changed depending on a movement of the upper electrode plate 60.

The light field lenses 70 may be disposed on the upper electrode plate 60 so that each light field lens 70 is vertically aligned with a corresponding group of the microlenses 18. The diameter of the light field lens 70 may be sufficiently greater than that of each of the microlenses 18, for example, at least 8 times or more. The field lens 70 may include a transparent organic matter.

The power source V may supply a DC voltage and/or a DC current to the supporting plate 20, the lower electrode posts 30, the lower electrode plate 40, the upper electrode posts 51 and/or the upper electrode plate 60.

A lower lens protection layer 25 and the upper lens protection layer 75 may include a transparent insulating material for protecting the microlenses 18 and the light field lens 70, respectively, from outer physical and chemical attacks. For example, the lower lens protection layer 25 and the upper lens protection layer 75 may include one of polyimide, a transparent organic matter, or a transparent inorganic material. In an embodiment of the present invention, the lower lens protection layer 25 and/or the upper lens protection layer 75 may be omitted.

As illustrated in FIG. 4C, the hole H may vertically penetrate the upper electrode plate 60 and the lower electrode plate 40. Part of the lower lens protection layer 25 may be exposed through the hole H.

Referring to FIGS. 3A to 3C, the image sensor, in accordance with an embodiment of the present invention may operate in conventional mode. Specifically, the upper electrode plate 60 may maintain a bottom state. For example, when a voltage is not applied to the lower electrode plate 40 and the upper electrode plate 60, the upper electrode plate 60 may maintain its lowermost bottom state also simply referred to as a bottom state. With the upper electrode plate 60 at its bottom state, as illustrated in FIG. 3A, the lower electrode plate 40 and the upper electrode plate 60 may be placed in such a way so as to be close to each other to the greatest degree possible without being in contact. Hence, a fine air gap AG may exist between the lower electrode plate 40 and the upper electrode plate 60 when the upper electrode plate 60 is at its bottom state. That is, the lower electrode plate 40 and the upper electrode plate 60 may not directly contact each other. With the upper electrode plate 60 at its bottom state, the interval between the microlenses 18 and the light field lenses 70 is reduced, hence, the light field lenses 70 contribution to image sensing is reduced. Accordingly, the image sensor in accordance with an embodiment of the present invention can sense an image in a first mode wherein the light field lenses 70 contribution to image sensing is substantially reduced or effectively eliminated. This first mode of operation may also be referred to as a conventional mode of operation.

Referring now back to FIGS. 4A to 4C, the image sensor in accordance with an embodiment of the present invention may operate in a light field mode. Specifically, the upper electrode plate 60 may maintain a top state as illustrated in FIG. 4A. For example, when voltages having the same polarity and amount are applied to the lower electrode plate 40 and the upper electrode plate 60, the upper electrode plate 60 may rise since a repulsive force may be generated between the lower electrode plate 40 and the upper electrode plate 60. That is, the lower electrode plate 40 and the upper electrode plate 60 may be spaced apart from each other. As the interval between the microlenses 18 and the light field lenses 70 is increased, the light field lenses 70 contribution to image sensing is increased and is maximized when the upper electrode plate 60 is at its top position. Accordingly, the image sensor in accordance with an embodiment of the present invention can sense an image in a second mode of operation also referred to hereinafter as a light field mode.

Figure 5A:
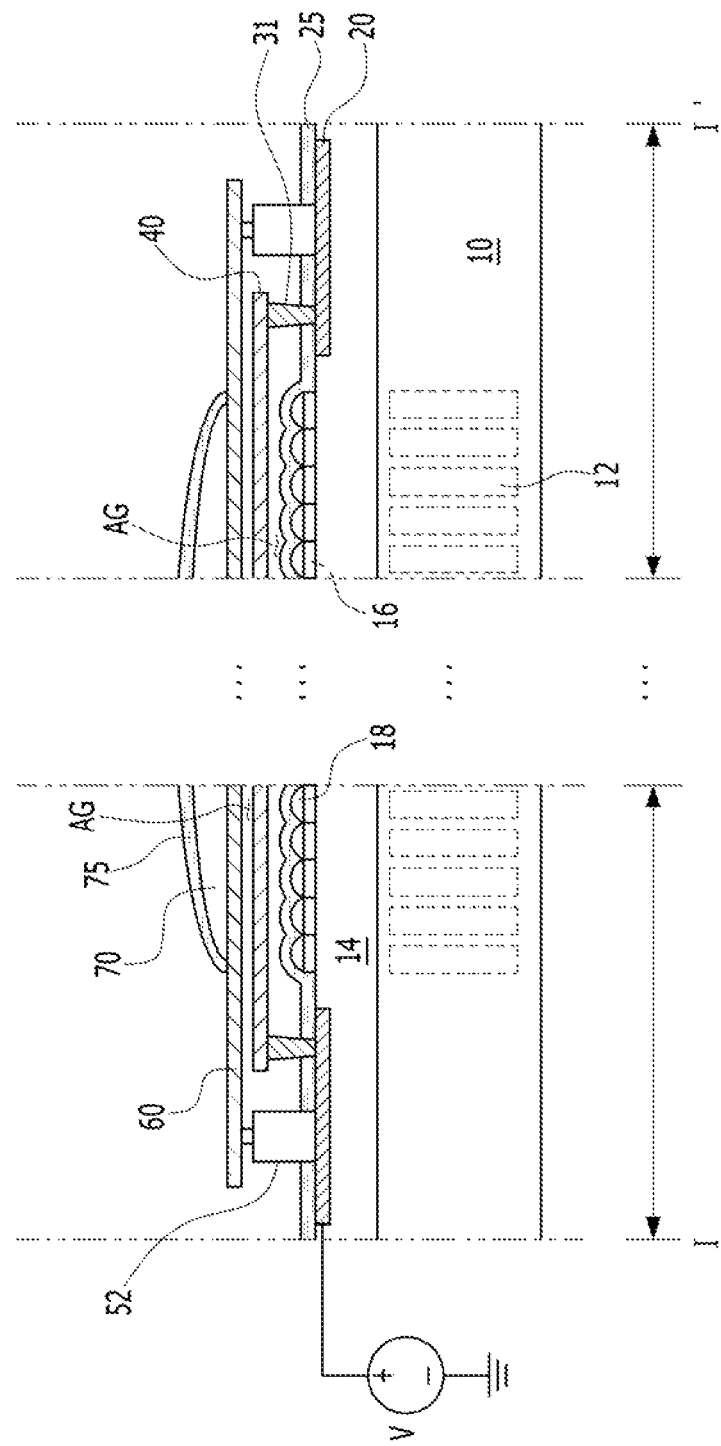

FIGS. 5A and 5B are schematic longitudinal sectional views of the image sensor taken along line I-I' of FIG. 2, in accordance with an embodiment of the present invention. Referring to FIGS. 5A and 5B, the image sensor may include an upper electrode post 52 which is or includes an actuator. The upper electrode post 52 is hereinafter referred to as actuator 52. The actuator 52 may raise and/or drop the upper electrode plate 60 using, for example, a current, hydraulic pressure, or atmospheric pressure. For example, the actuator 52 may include a voltage actuator, a current actuator, or a piezoelectric actuator. FIG. 5A shows an example of an image sensor in conventional mode in which the upper electrode plate 60 maintains the bottom state without rising. FIG. 5B shows an example of an image sensor in light field mode in which the upper electrode plate 60 is raised by the upper electrode post 52 and maintains the top state. One or more actuators 52 may be used for each upper electrode plate 60.

Figure 6:
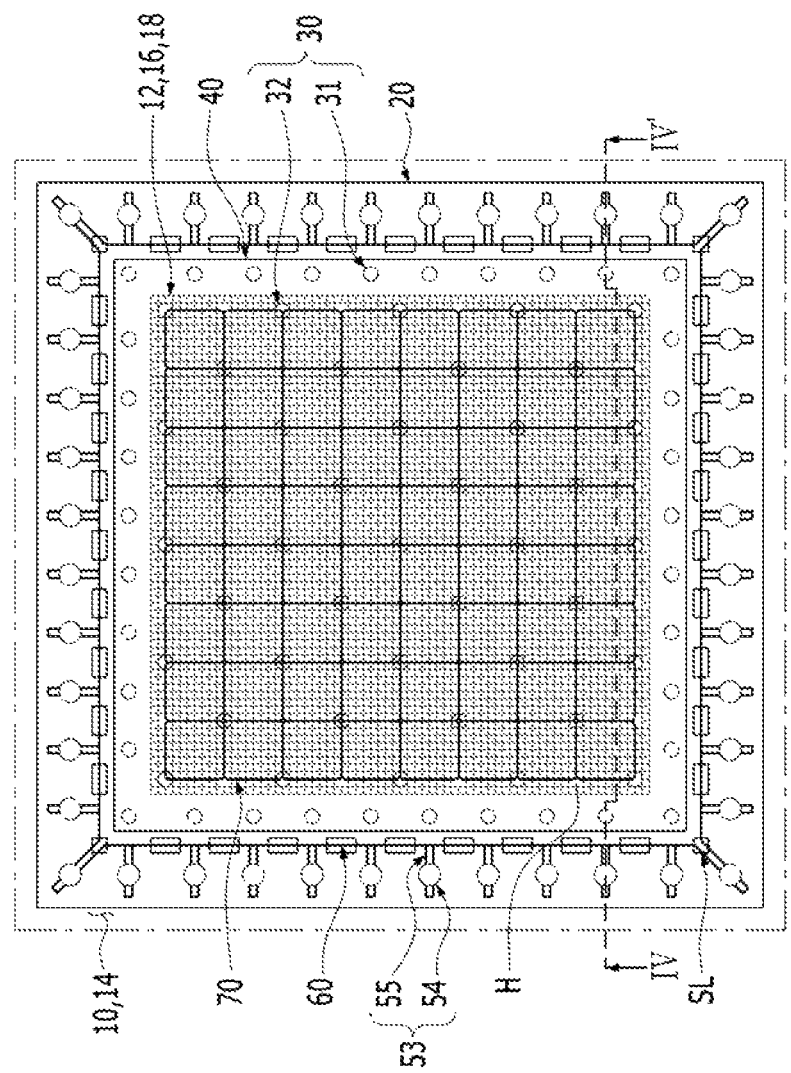
FIG. 6 is a layout diagram schematically showing an image sensor in accordance with an embodiment of the present invention.

FIG. 6 is a layout diagram schematically showing an image sensor, in accordance with another embodiment of the present invention, FIGS. 7A to 8B are schematic longitudinal sectional views of the image sensor taken along line IV-IV' of FIG. 6.

Figure 7A:
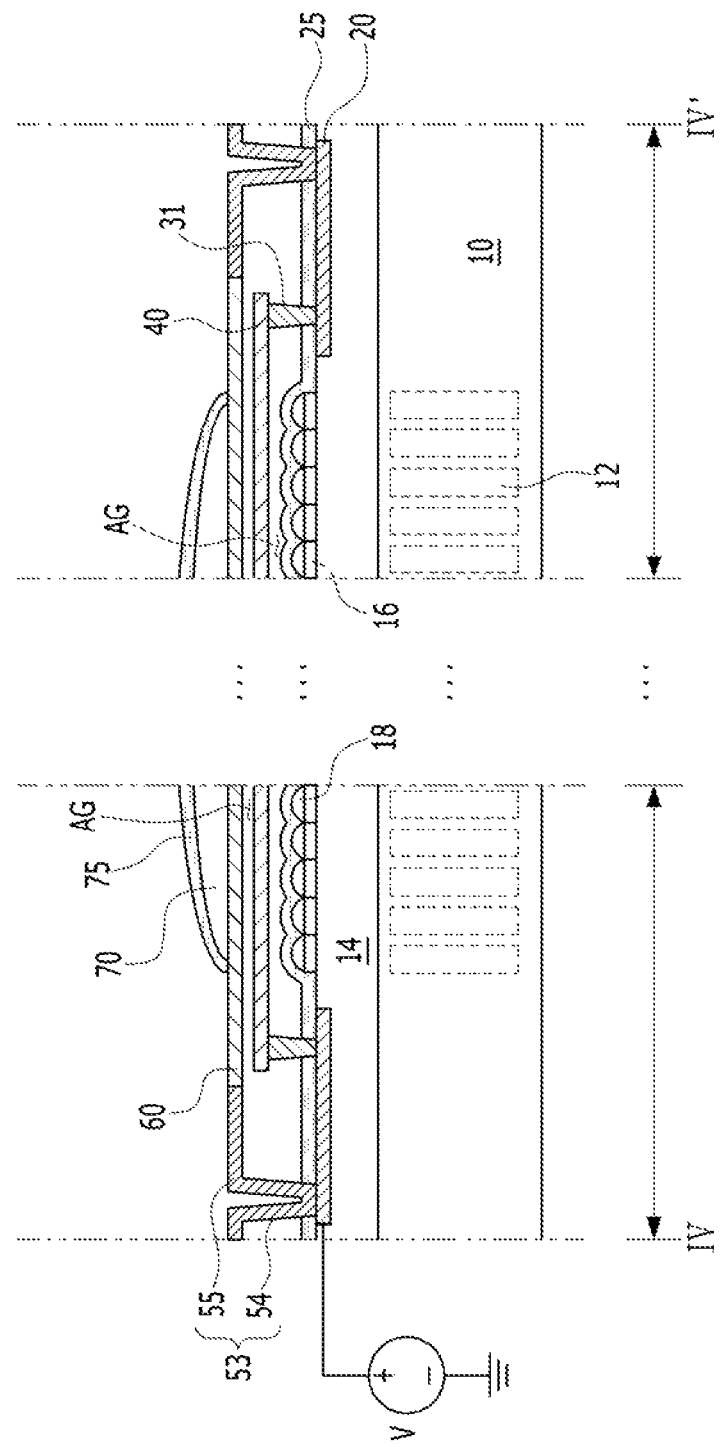
FIGS. 7A to 7B are schematic longitudinal sectional views of the image sensor taken along line IV-IV' of FIG. 6.
Figure 7B:
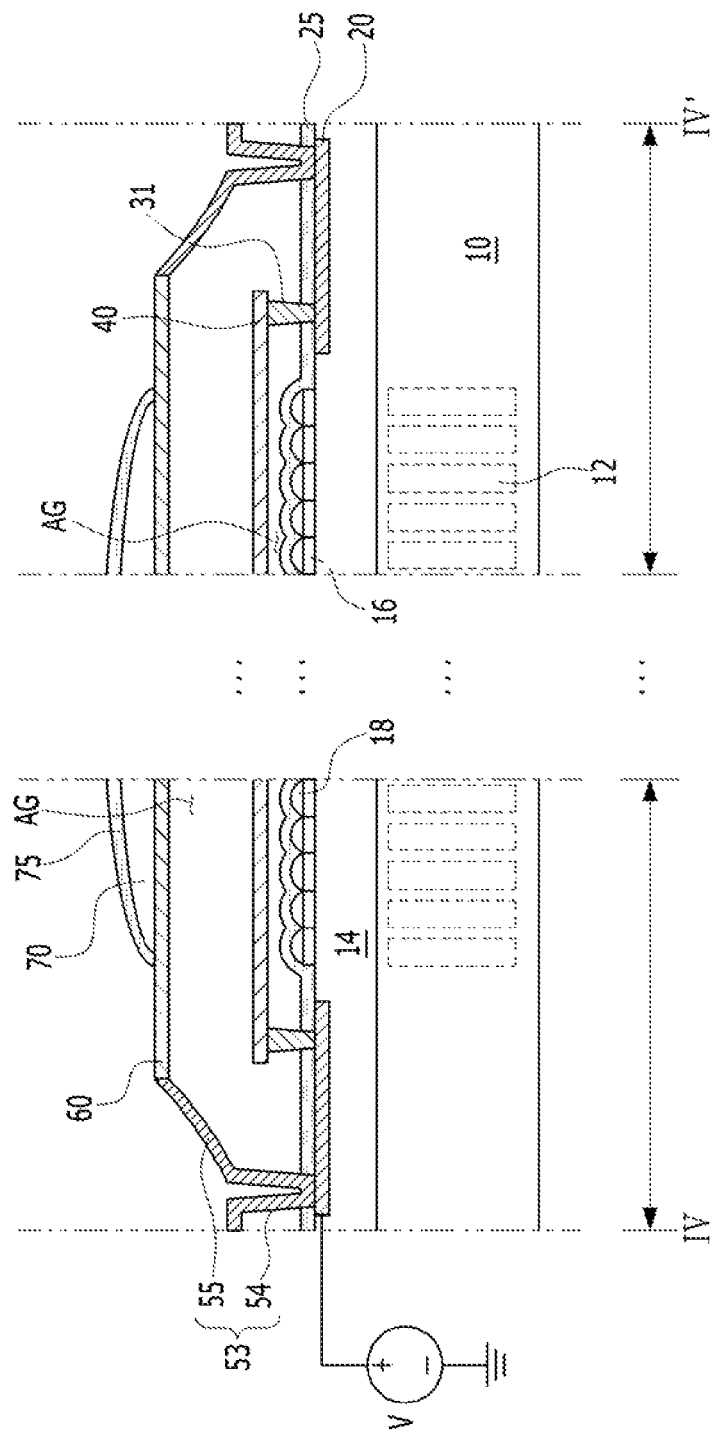

Referring to FIGS. 6, 7A, and 7B, the image sensor may include upper electrode posts 53, each having a fixed supporting post 54 and a supporting arm 55 between the supporting post 54 and the upper electrode plate 60, in comparison with the image sensors shown in FIGS. 2 to 5C. The supporting post 54 may have a fixed pillar or post shape. Specifically, the supporting post 54 may have a cylinder shape having a wider upper portion and a narrower lower portion. The supporting arm 55 may include metal having elasticity, such as spring steel. In the illustrated embodiment, the supporting post 54 and the supporting arm 55 includes the same metal so that they may integrally be formed as a single body. FIG. 7A shows an example of an image sensor in conventional mode in which the upper electrode plate 60 maintains the bottom state without rising. FIG. 7B shows an example of an image sensor in light field mode in which the upper electrode plate 60 is raised by the upper electrode posts 53 and maintains the top state. As illustrated in FIG. 7B, the supporting arm 55 may be flexibly bent. Furthermore, the supporting arm 55 may have a force of restoration. A voltage may not be applied to the upper electrode plate 60 and the lower electrode plate 40 in conventional mode. A voltage may be applied to the upper electrode plate 60 and the lower electrode plate 40 in light field mode, so a mutual repulsive force may act on the upper electrode plate 60 and the lower electrode plate 40 to cause the upper electrode plate 60 to rise to its top state exploiting the flexibility of the supporting arm 55. When no voltage is applied to the upper electrode plate 60 and the lower electrode plate 40, the upper electrode plate 60 returns to the bottom state due to the restoration force of the supporting arm 55.

Figure 8:
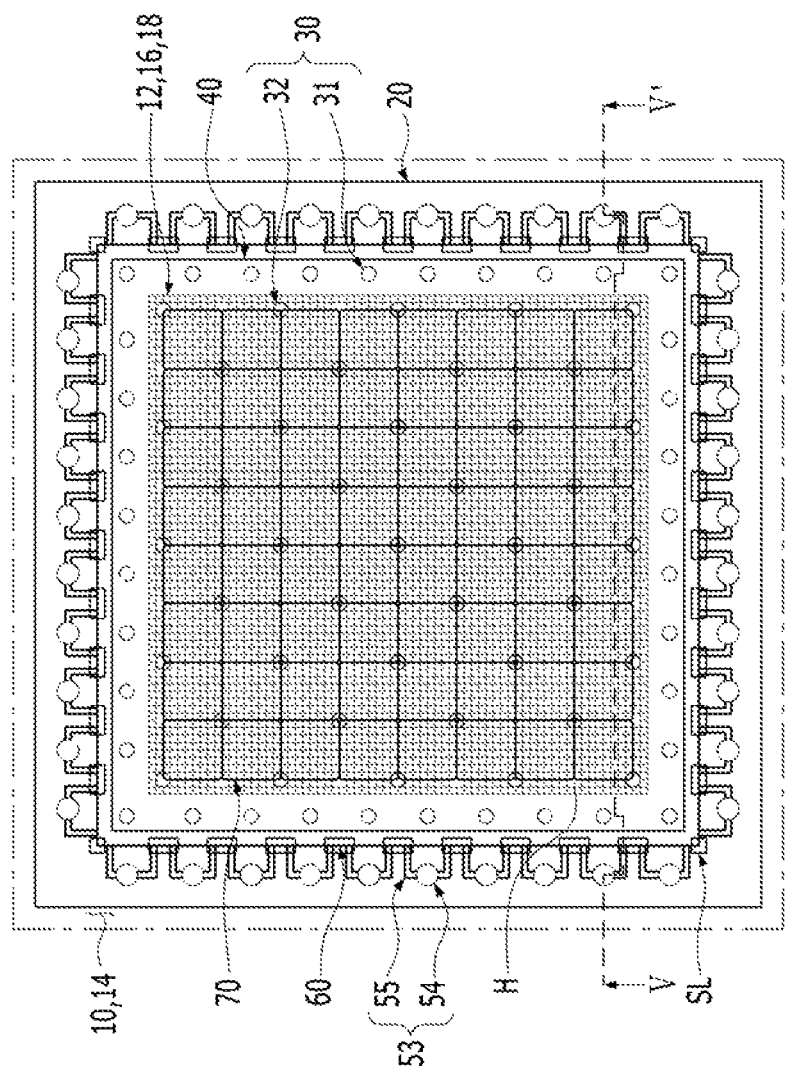
FIG. 8 is a layout diagram schematically showing an image sensor in accordance with an embodiment of the present invention.

FIG. 8 is a layout diagram schematically showing an image sensor, in accordance with a yet another embodiment of the present invention. Referring to FIG. 8, the image sensor in accordance with an embodiment of the present invention may include upper electrode posts 53 each having a fixed supporting post 54 and a plurality of thinner supporting arms 55, compared to the image sensor shown in FIG. 6. As the supporting arms 55 are thinner and increased in number, an upper and down movement displacement of the upper electrode plate 60 may be further increased.

Figure 9A:
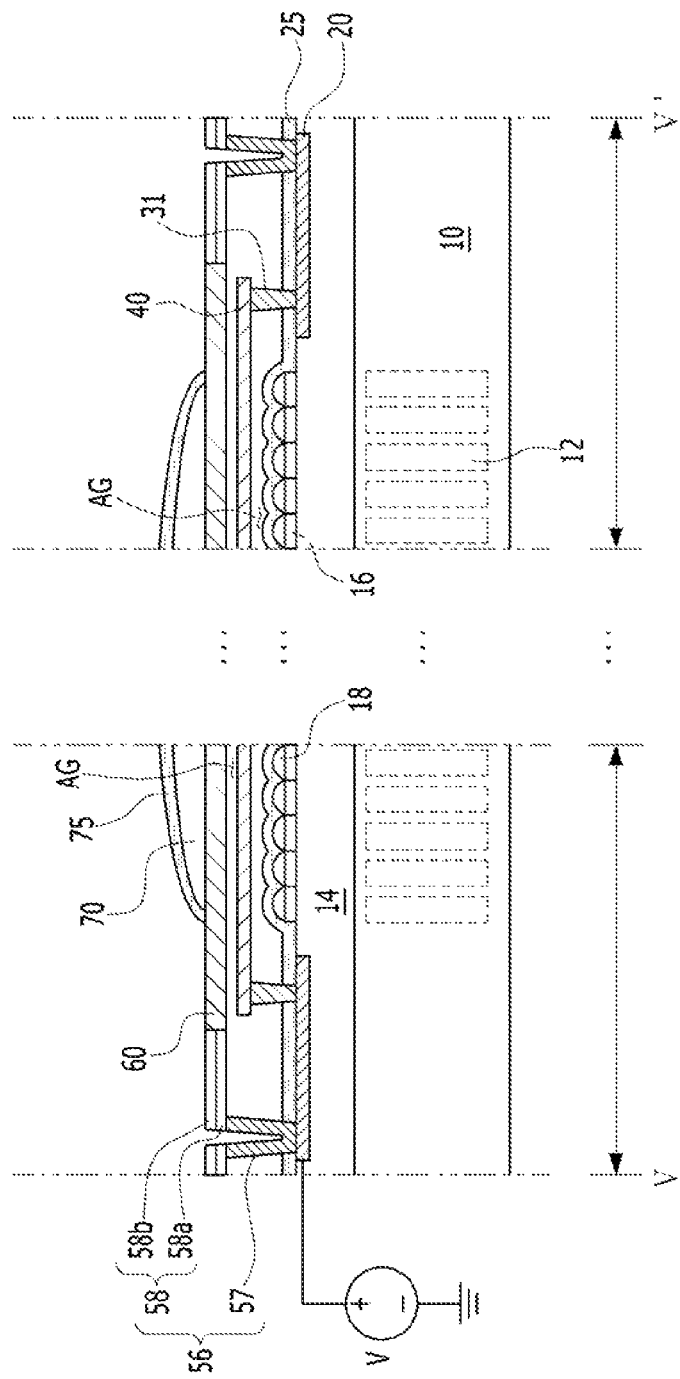

FIGS. 9A and 9B are schematic longitudinal sectional views of the image sensor taken along line IV-IV' of FIG. 6, in accordance with another embodiment of the present invention.

Referring to FIGS. 9A and 9B, the image sensor may include upper electrode posts 56 each having a fixed supporting post 57 and a supporting arm 58 having a bi-metal device or a bi-morph piezoelectric device, in comparison with the image sensors shown in FIGS. 6 to 8. For example, if the supporting arm 58 includes the bi-metal device, it may include a lower supporting arm 58a having a relatively high coefficient of thermal expansion and an upper supporting arm 58b having a relatively low coefficient of thermal expansion. Accordingly, when a voltage is applied to the supporting arm 58, the supporting arm 58 may be upwardly bent as shown in FIG. 9B. In this case, a repulsive force may further act between the lower electrode plate 40 and the upper electrode plate 60. The lower supporting arm 58a may include nickel/manganese/iron, nickel/manganese/copper, nickel/molybdenum/iron, copper/zinc, nickel/iron/chrome, or other metal alloys. The upper supporting arm 58b may include nickel/iron or other metal alloys.

In some embodiments of the present invention, if the supporting arm 58 includes a bi-morph piezoelectric device, when a voltage is applied to the supporting arm 58, the supporting arm 58 may be upwardly bent as shown in FIG. 9B. The supporting arm 58 may include barium titanate ($BaTiO_3$), lead titanate ($PbTiO_3$), lead zirconate titanate (PZT) ($PbTiO_3$—$PbZrO_3$), or other piezoelectric materials. In some embodiments of the present invention, the supporting arm 58 including the piezoelectric device may be formed of a dual layer as shown in FIGS. 9A and 9B or may be formed of a single layer as shown in FIGS. 7A and 7B.

FIGS. 10A to 19C are schematic longitudinal sectional views of the image sensor taken along line IV-IV' of FIG. 6 and II-II' and III-III' of FIG. 2 for describing a method of forming the image sensor, in accordance with an embodiment of the present invention. For example, a method for forming the image sensor described with reference to FIGS. 6 to 7B is described. FIGS. 10A to 19A chiefly show the outer peripheral area, and FIGS. 10B and 10C to 19B and 19C show the pixel area.

Figure 10A:
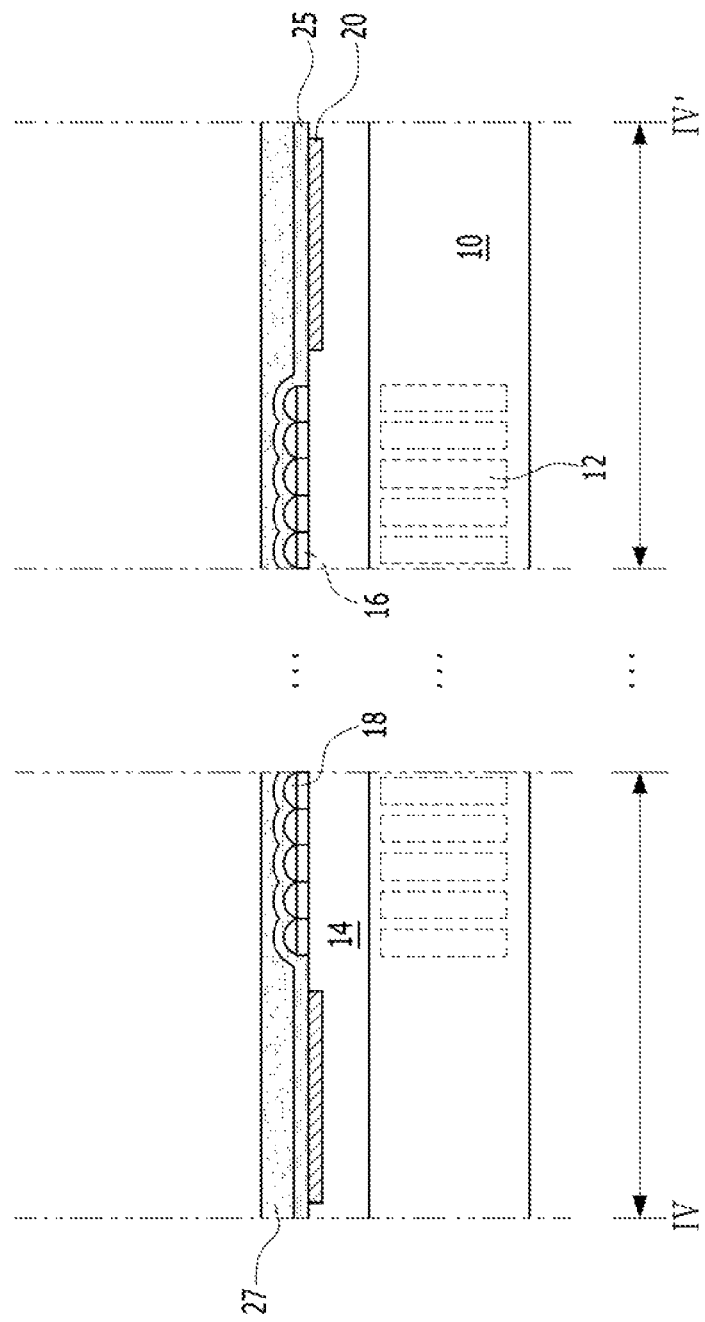

Referring to FIGS. 10A to 10C, the method for forming the image sensor, in accordance with an embodiment of the present invention, may include forming the middle layer 14 on the substrate 10 having the photodiodes 12 therein. The method may further include forming the supporting plate 20, the color filters 16, and the microlenses 18 on the middle layer 14. The method may further include the lower lens protection layer 25 being configured to cover the supporting plate 20, the color filters 16, and the microlenses 18. The method may further include forming a lower sacrificial layer 27 on the lower lens protection layer 25. The lower lens protection layer 25 may protect the microlenses 18 from outer physical and chemical attacks during an etch process. The lower lens protection layer 25 may include silicon oxide, a spin on hardmask (SOH), or organic polymer resin formed through a coating process so that the lower lens protection layer 25 has an etch selectivity with respect to the lower sacrificial layer 27. The lower sacrificial layer 27 may include at least one of silicon oxide, silicon nitride, and a polymer organic matter formed through a deposition process or a coating process.

Figure 11A:
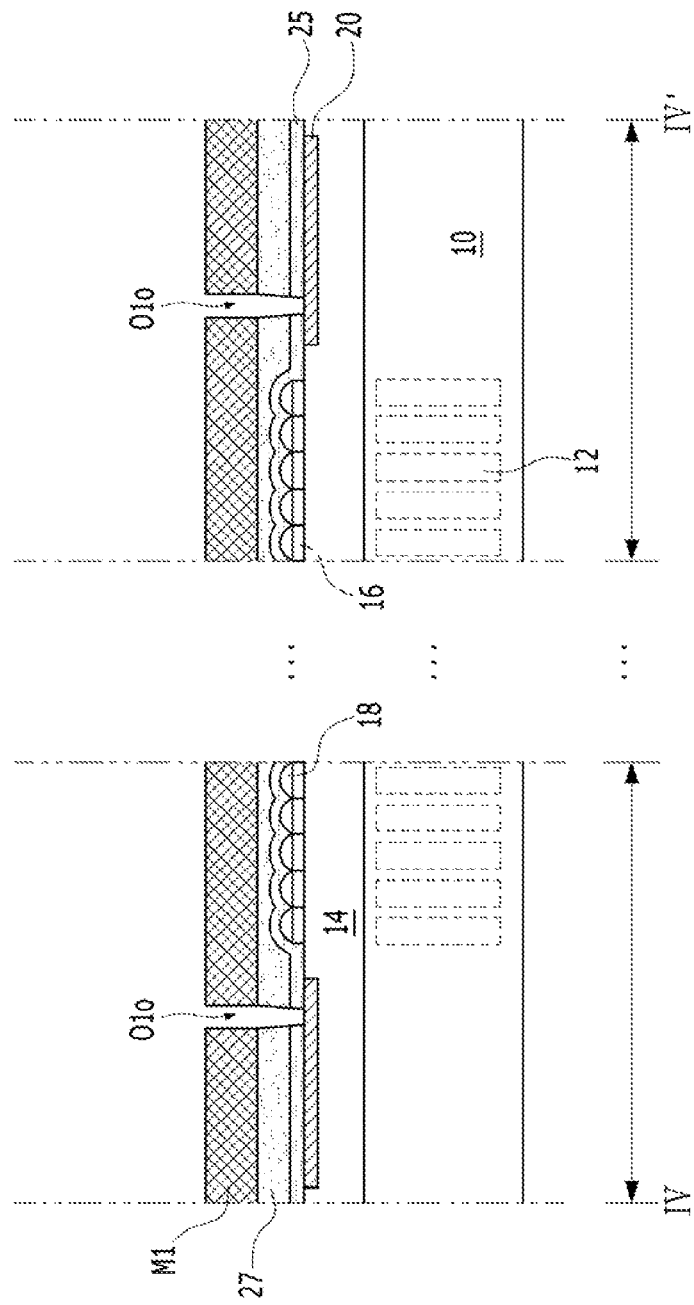

Referring to FIGS. 11A to 11C, the method may include forming a first etch mask M1 over the lower sacrificial layer 27 and forming lower post openings O1o and O1i through which a part of the supporting plate 20 is exposed by performing a first etch process. The lower post openings O1o and O1i include the outer lower post opening O1o formed outside the pixel area and the internal lower post opening O1i formed inside the pixel area. The first etch mask M1 may include a photoresist including an organic polymeric material or a hard mask including an inorganic material. The first etch process may include selectively removing the lower sacrificial layer 27 and the lower lens protection layer 25 using the first etch mask M1 as an etch mask. The supporting plate 20 may be used as an etch-stop layer. Thereafter, the first etch mask M1 may be removed.

Figure 12A:
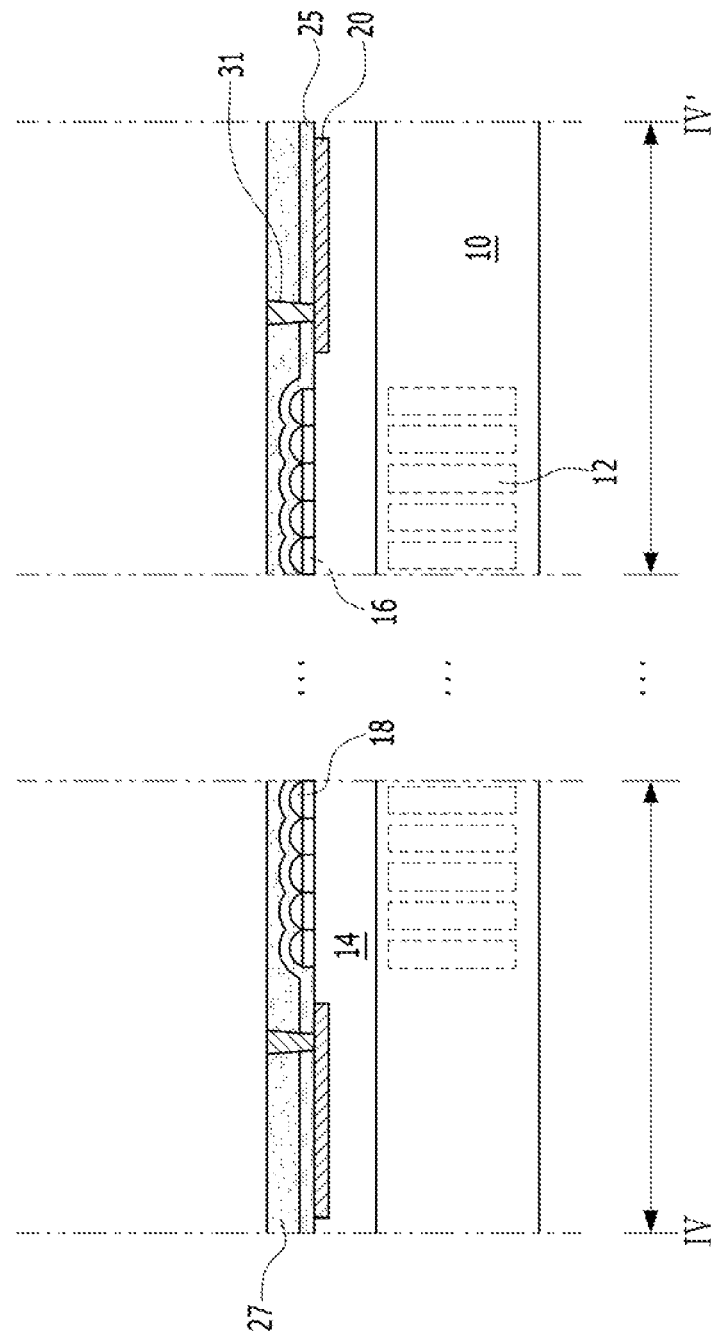
Figure 12B:
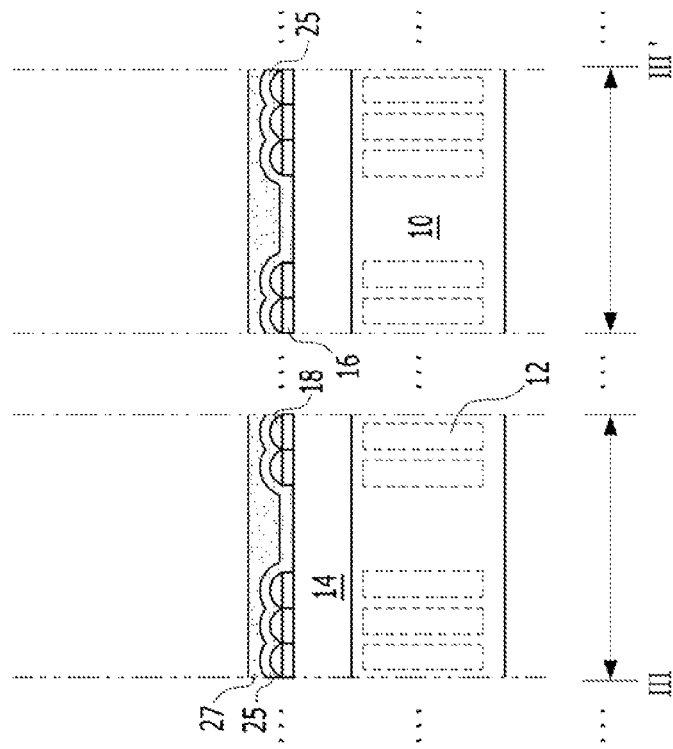
Figure 12C:
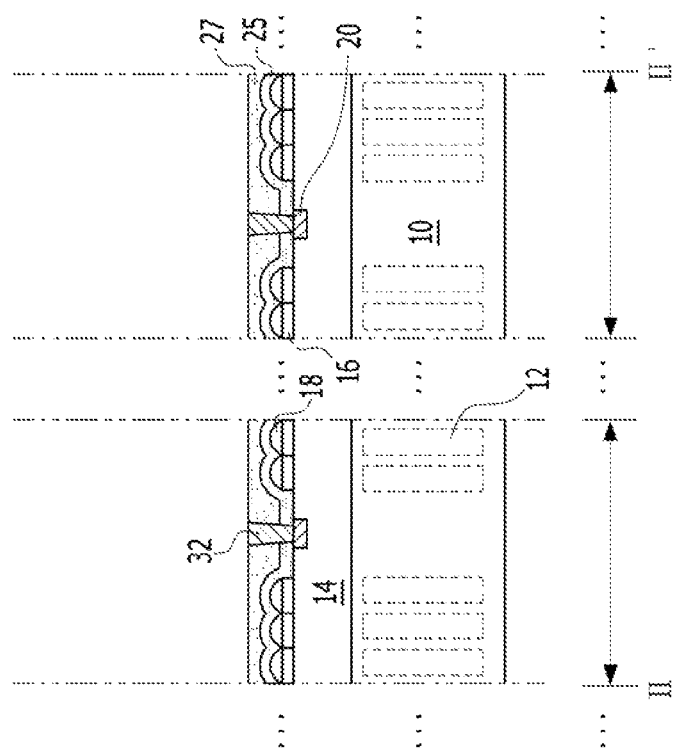

Referring to FIGS. 12A to 12C, the method may include forming the lower electrode posts 31 and 32 within the lower post openings O1o and O1i. The lower electrode posts 31 and 32 may include an outer lower electrode post 31 and an inner lower electrode post 32. The lower electrode posts 31 and 32 may include forming a conductor, such as metal, within the lower post openings O1o and O1i by performing a physical vapor deposition (PVD) process, a chemical vapor deposition (CVD) process, a plating process, or a filling process. The method may further include planarizing the top surfaces of the lower electrode posts 31 and 32 and the lower sacrificial layer 27, for example, by performing a chemical mechanical polishing (CMP) process.

Figure 13A:
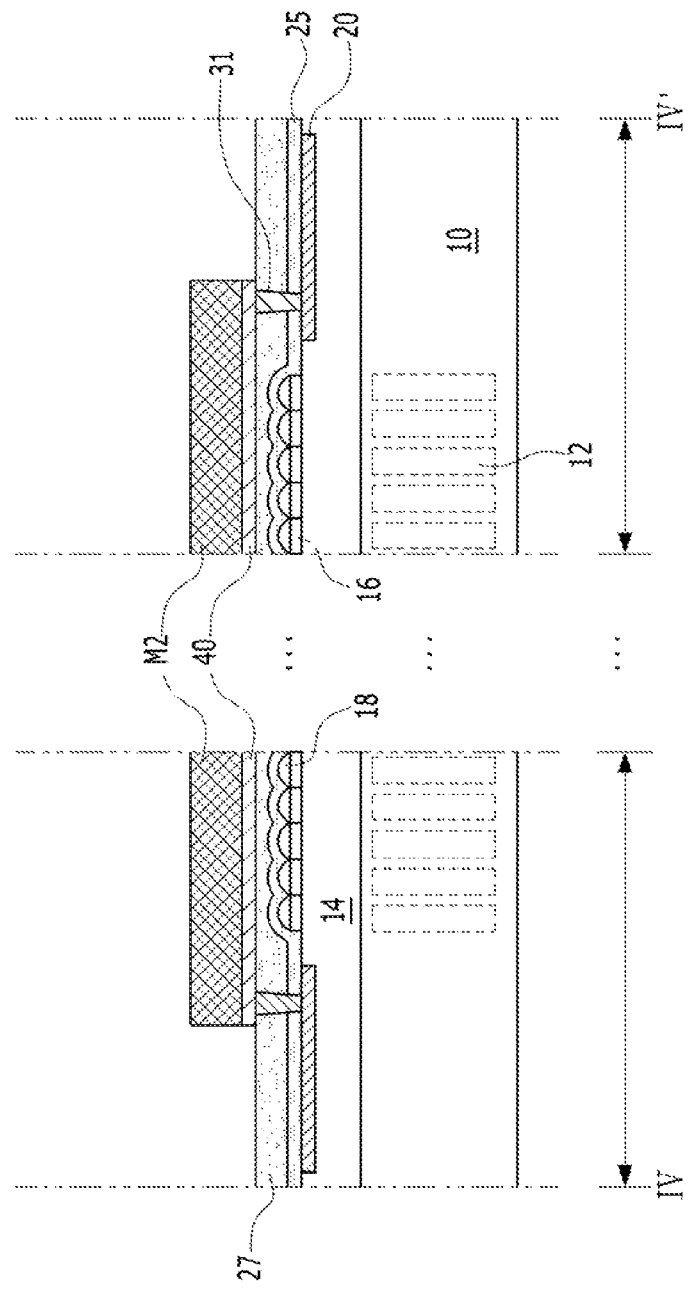

Referring to FIGS. 13A to 13C, the method may further include forming the lower electrode plate 40. Forming, the lower electrode plate 40 may include forming at least one indium-tin oxide (ITO), indium-zinc oxide (IZO), zinc oxide (ZnO), or other transparent electrode layers on the lower sacrificial layer 27 and the lower electrode posts 31 and 32, then forming a second etch mask M2 on the transparent electrode layer, and patterning the transparent electrode layer by performing a second etch process. The second etch mask M2 may include the same material as the first etch mask M1. The second etch process may include patterning the transparent electrode layer using the second etch mask M2 as an etch mask. Thereafter, the third etch mask M3 may be removed.

Figure 14A:
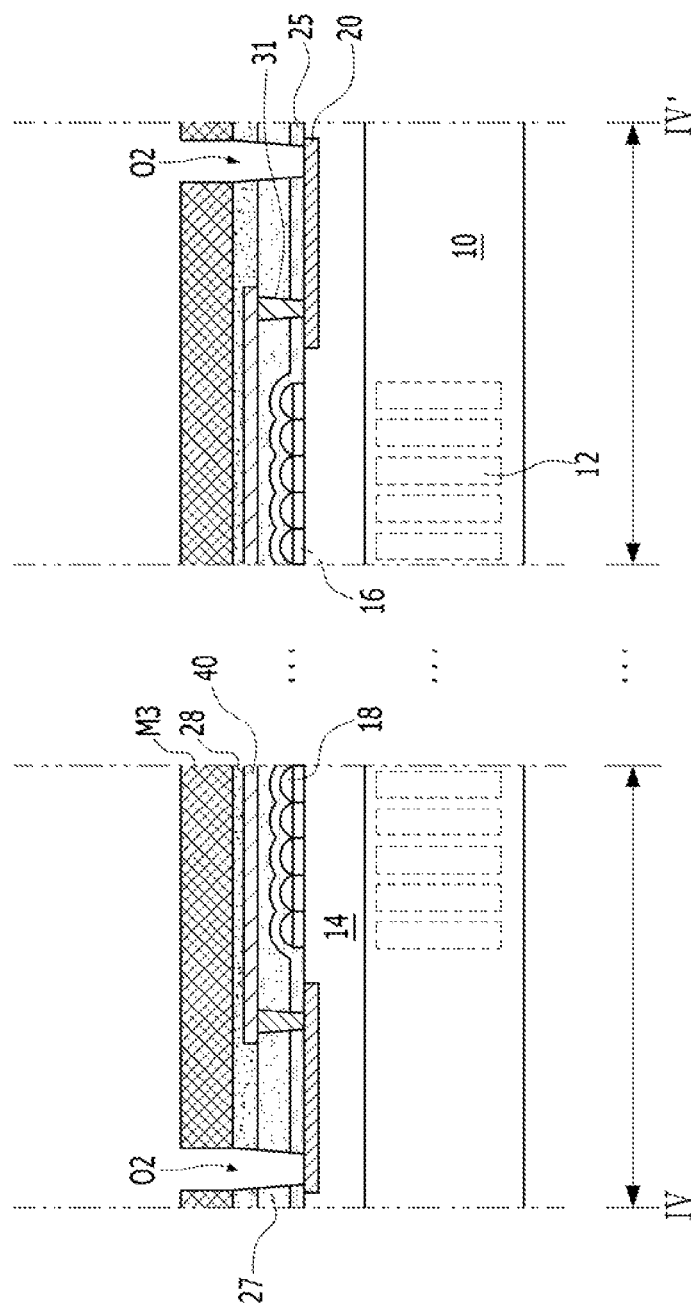

Referring to FIGS. 14A to 14C, the method may further include forming a middle sacrificial layer 28, forming a third etch mask M3, and forming upper post openings O2 through which the supporting plate 20 is exposed by performing a third etch process. The middle sacrificial layer 28 may include the same material as the lower sacrificial layer 27. The third etch mask M3 may include the same material as the first etch mask M1 and the second etch mask M2. The third etch process may include selectively removing the middle sacrificial layer 28 and the lower sacrificial layer 27 using the third etch mask M3 as an etch mask. The lower sacrificial layer 27 may be used as an etch-stop layer. The supporting plate 20 may be used as an etch-stop layer. Thereafter, the second etch mask M2 may be removed.

Figure 15A:
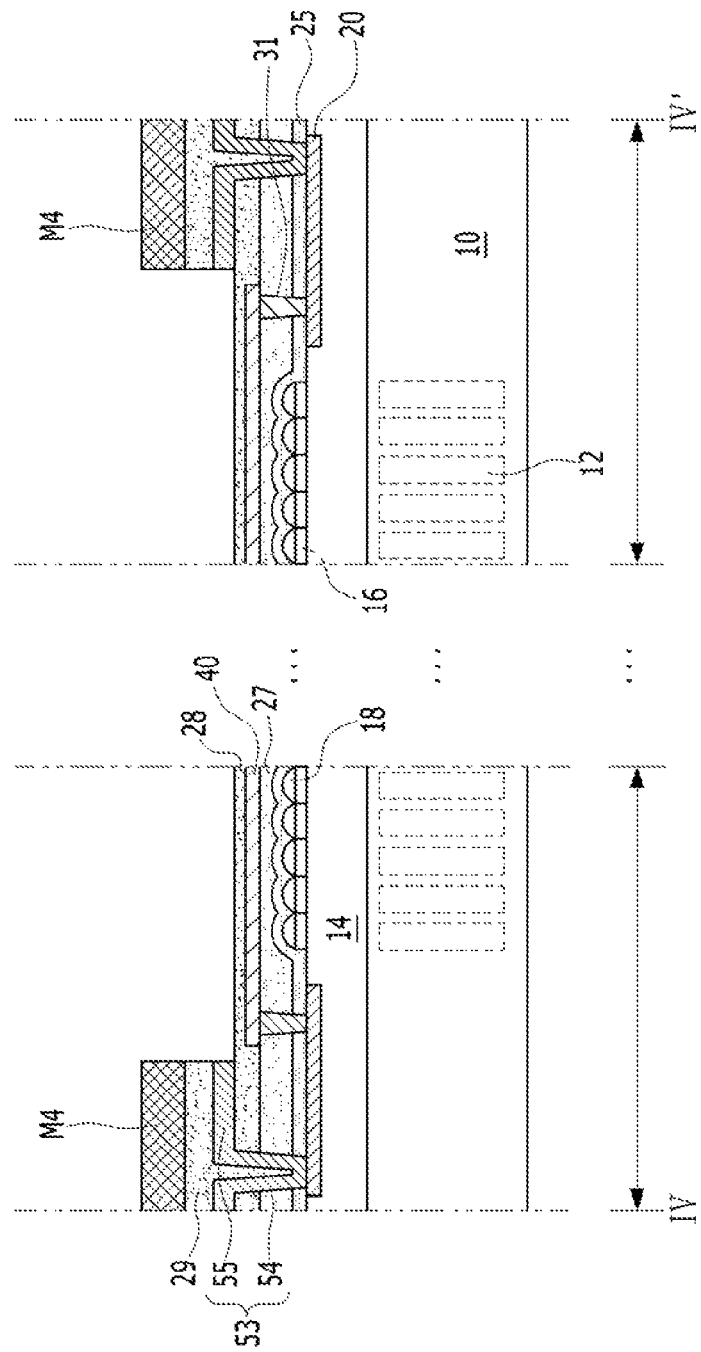

Referring to FIGS. 15A to 15C, the method may include forming a post material layer on the middle sacrificial layer 28, forming an upper sacrificial layer 29, forming a fourth etch mask M4 on the upper sacrificial layer 29, and forming the upper electrode posts 53 each having the fixed supporting post 54 and the supporting arm 55 by performing a fourth etch process using the fourth etch mask M4 as an etch mask. The middle sacrificial layer 28 may be exposed in the pixel area in which the photodiodes 12, the color filters 16, and the microlenses 18 have been disposed. The post material layer, the supporting posts 54, and the supporting arms 55 may include a metal structure having an effective level of elasticity. The upper sacrificial layer 29 may include the same material as the lower sacrificial layer 27 and/or the middle sacrificial layer 28. The fourth etch mask M4 may be vertically aligned with the upper electrode posts 53 and may expose the pixel area. Accordingly, the middle sacrificial layer 28 may be exposed in the pixel area. Thereafter, the fourth etch mask M4 may be removed.

Figure 16A:
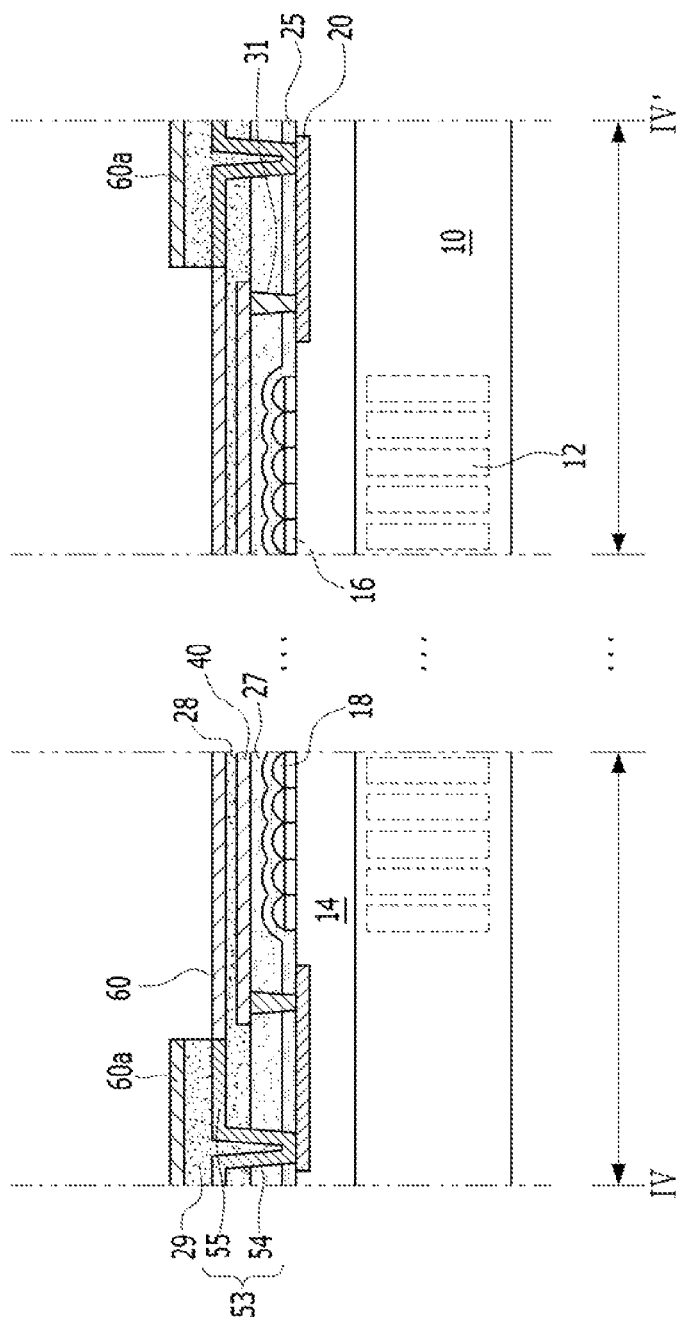

Referring to FIGS. 16A to 16C, the method may include forming a transparent electrode material layer 60, 60a. The transparent electrode material layer 60, 60a may include the upper electrode plate 60 in the pixel area and an excess material layer 60a on the supporting posts 54 and the supporting arms 55.

Figure 17A:
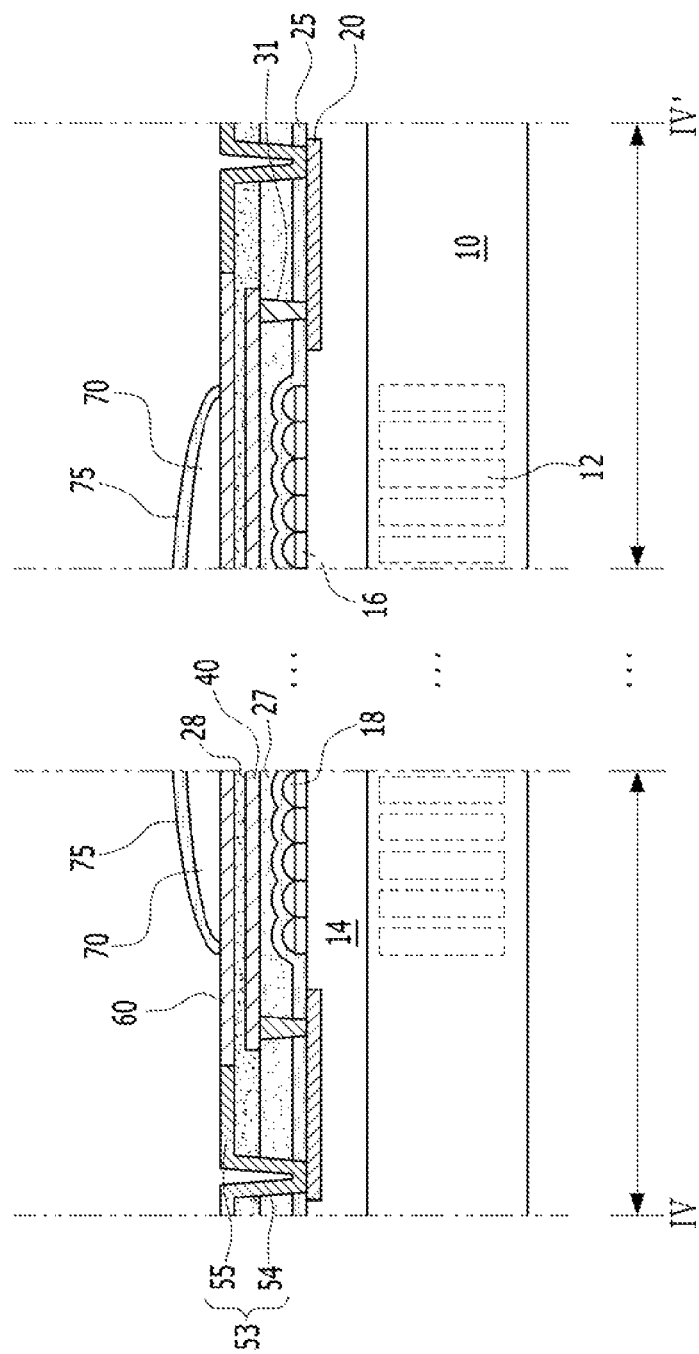
Figure 17B:
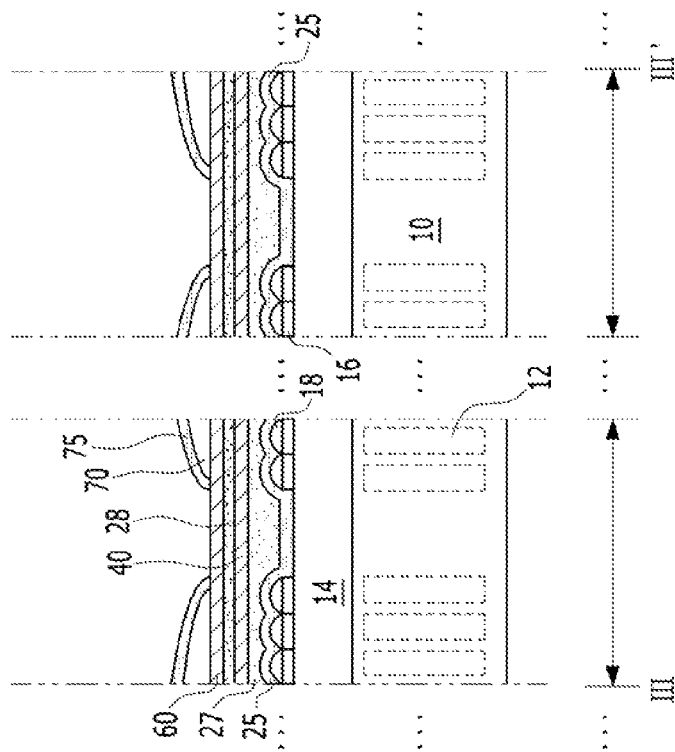
Figure 17C:
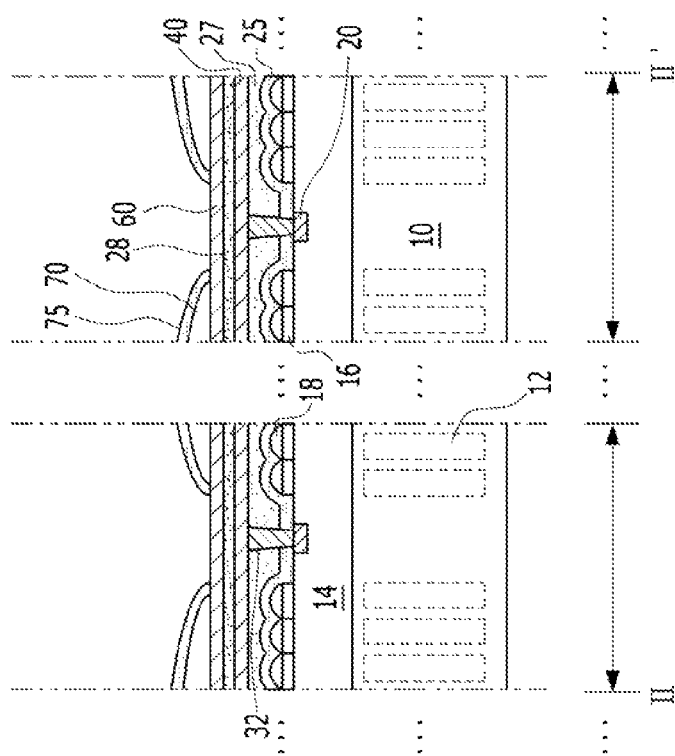

Referring to FIGS. 17A and 17B, the method may include removing the upper sacrificial layer 29, removing the excess material layer 60a on the upper sacrificial layer 29, forming the light field lens 70 on the upper electrode plate 60 of the pixel area, and forming the upper lens protection layer 75 configured to cover the light field lens 70. The light field lens 70 may include organic polymer resin. The upper lens protection layer 75 may include polyimide, a transparent organic matter, or a transparent inorganic matter.

Figure 18B:
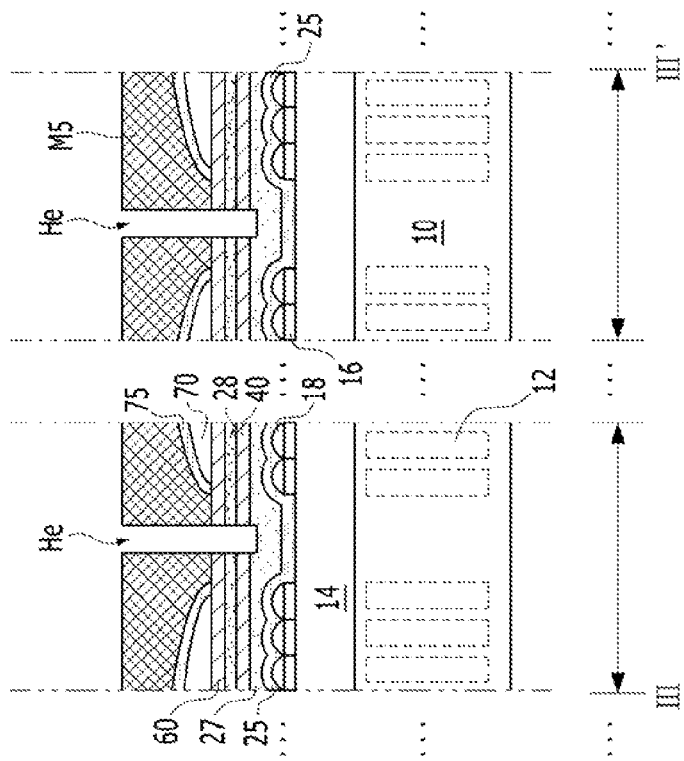
Figure 18C:
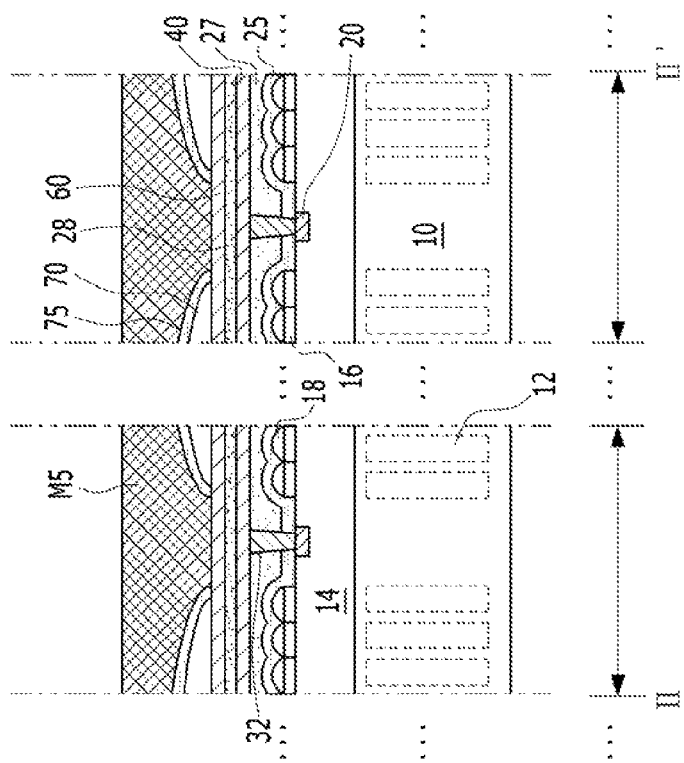

Referring to FIGS. 18A to 18C, the method may further include forming a fifth etch mask M5 and forming etch holes He through which part of the lower sacrificial layer 27 is exposed through the upper electrode plate 60, the middle sacrificial layer 28, and the lower electrode plate 40 by performing a fifth etch process using the fifth etch mask M5. The bottom of the etch hole He may be placed within the lower sacrificial layer 27. Thereafter, the fifth etch mask M5 may be removed.

Figure 19A:
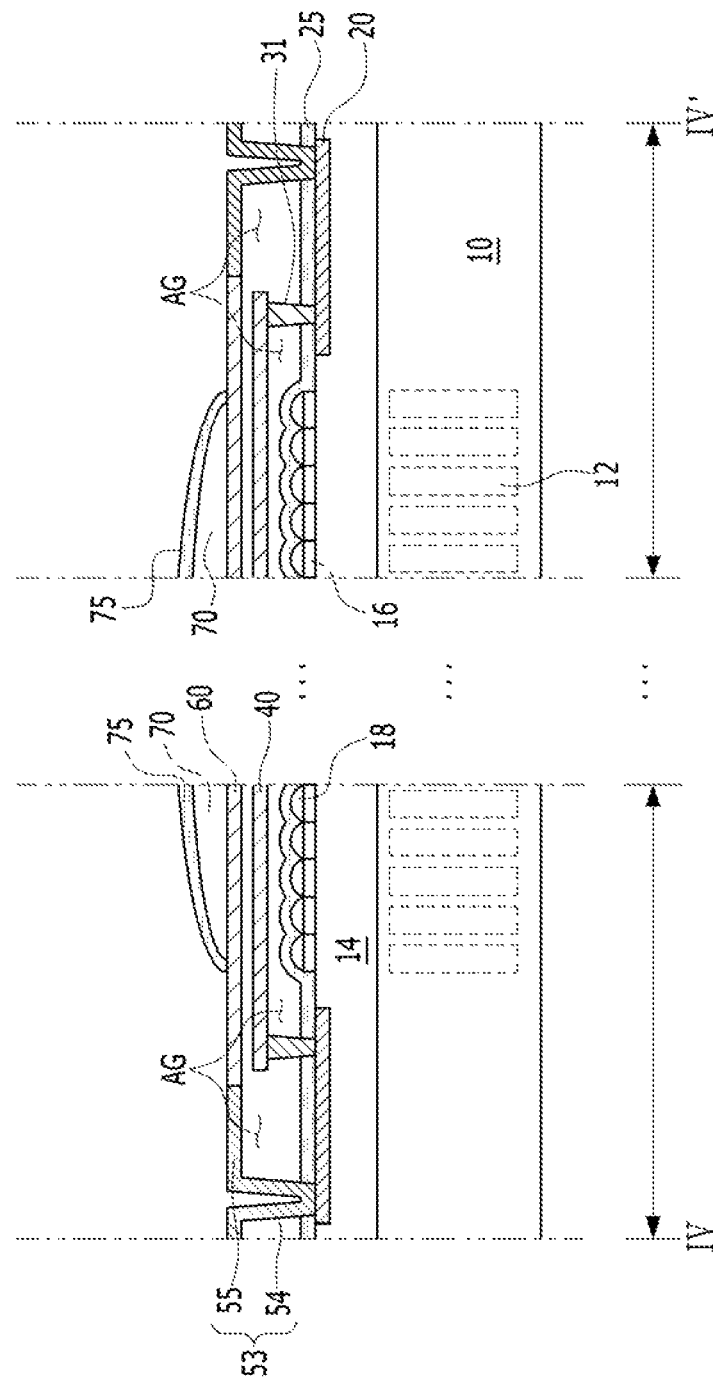
Figure 19B:
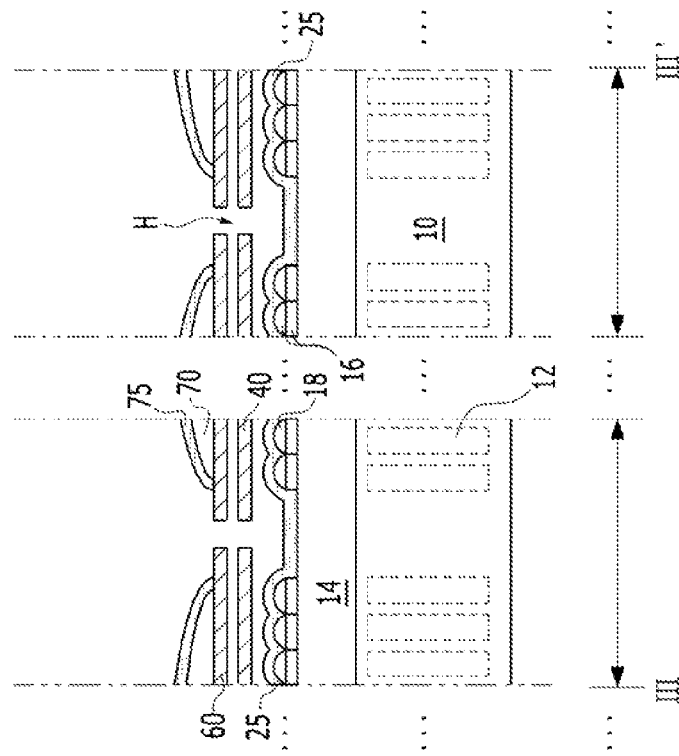
Figure 19C:
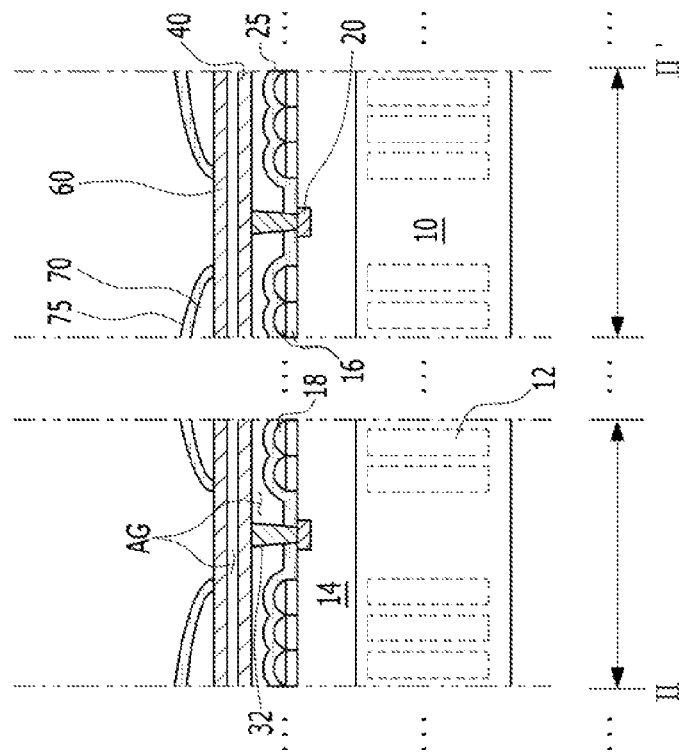

Referring to FIGS. 19A to 19C, the method may further include, forming the air gaps AG, by removing the middle sacrificial layer 28 and the lower sacrificial layer 27 through the etch holes He. In another embodiment of the present invention, a process for removing the lower lens protection layer 25 and/or the upper lens protection layer 75 may be further performed.

Figure 20:
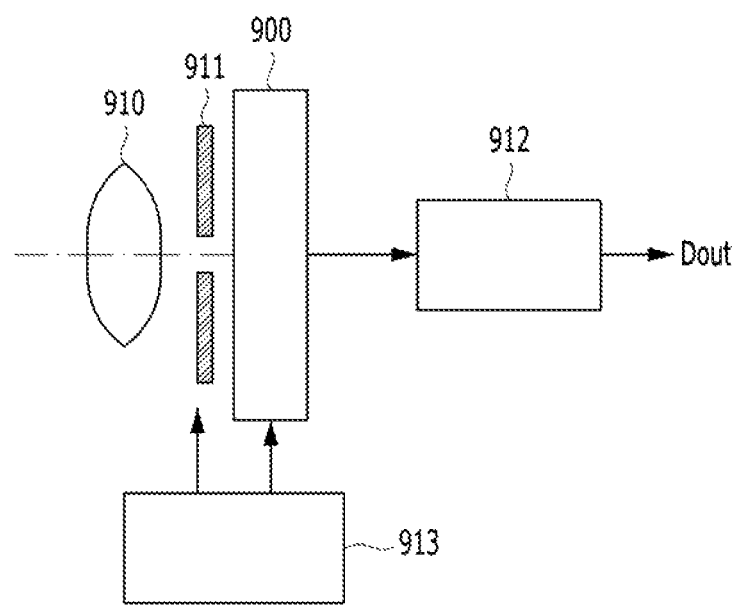
FIG. 20 is a diagram schematically illustrating an electronic device including an image sensor in accordance with an embodiment of the present invention.

FIG. 20 is a diagram schematically illustrating an electronic device including at least one image sensor in accordance with various embodiments of the present invention.

Referring to FIG. 20, the electronic device may include a camera capable of capturing a still image or a moving image. The electronic device may include an optical system for example, an optical lens 910, a shutter unit 911, an image sensor 900, a driving unit 913 and a signal processing unit 912 configured to control/drive the shutter unit 911.

The optical system 910 guides image light or incident light from a photography subject to the pixel area, for example pixel area 100 of FIG. 1, of the image sensor 900. The optical system 910 may include a plurality of optical lenses. The shutter unit 911 controls the light radiation and shield periods of the image sensor 900. The driving unit 913 controls the transmission operation of the image sensor 900 and the shutter operation of the shutter unit 911. The signal processing unit 912 performs a variety of types of signal processing on a signal output by the image sensor 900. An image signal Dout after the signal processing is stored in a storage medium, such as memory, or is displayed on a monitor.

Each of the image sensors in accordance with various embodiments of the technical spirit of the present invention can implement image sensing according to two photographing schemes using a single image sensor because the image sensor has both a light field mode and a conventional mode.

Each of the image sensors, in accordance with various embodiments of the present invention, can implement image sensing methods according to two photographing schemes by selecting a light field mode or a conventional mode through electronic and/or mechanical control.

Each of the image sensors in accordance with various embodiments of the present invention can minimize a loss of light due to the air gap being present between the microlenses and the light field lenses.

Other advantages according to various embodiments of the present invention have been described in the text.

Although various embodiments have been described for illustrative purposes, it will be apparent to those skilled in the art that various changes and modifications may be made without departing from the spirit and scope of the invention as defined in the following claims.

What is claimed is:

1. An image sensor, comprising:
   a plurality of first lenses disposed on a substrate; and
   a plurality of second lenses disposed on a structure disposed on the substrate suitable for changing a distance between the first and second lenses from a first minimum distance where the image sensor operates in a first mode to a second maximum distance where the image sensor operates in a second mode.

2. The image sensor of claim 1, wherein the structure comprises a lower and an upper electrode plate, the lower electrode plate is fixed, and the upper electrode plate is movable.

3. The image sensor of claim 2, wherein the structure further comprises a support plate, the upper and lower electrode plates are coupled to the support plate via an upper and a lower electrode posts, respectively, the upper electrode plate is configured to move upward and downward by the upper electrode post.

4. The image sensor of claim 2, wherein each of the second lenses has a greater diameter than each of the first lenses.

5. The image sensor of claim 1, wherein the substrate comprises a pixel area and a peripheral area surrounding the pixel area,
   wherein the first and second lenses are disposed within the pixel area, and
   wherein the upper electrode post is disposed within the peripheral area.

6. The image sensor of claim 5, wherein the lower electrode post comprises:
   an inner lower electrode post disposed in the pixel area; and
   an outer lower electrode post disposed in the peripheral area, wherein an air gap exists between the first lenses and the lower electrode plate, and between the lower electrode plate and the upper electrode plate.

7. The image sensor of claim 6, wherein the upper electrode post comprises MEMS springs.

8. The image sensor of claim 6, wherein the upper electrode post comprises a fixed supporting post and a supporting arm.

9. The image sensor of claim 8, wherein the supporting arm has flexibility and a force of restoration.

10. The image sensor of claim 8, wherein the supporting arm comprises one of a bi-metal or a bi-morph piezoelectric device.

11. An image sensor, comprising:
a substrate having a pixel area and a peripheral area surrounding the pixel area;
color filters and microlenses suitable for being disposed on the substrate corresponding to the pixel area;
a supporting plate disposed on the substrate corresponding to the peripheral area;
lower electrode posts and upper electrode posts disposed on the supporting plate;
a lower electrode plate horizontally disposed on the lower electrode posts;
an upper electrode plate horizontally disposed on the upper electrode posts; and
light field lenses disposed on the upper electrode plate,
wherein the upper electrode plate is suitable for moving so that an interval between the lower electrode plate and the upper electrode plate is changed.

12. The image sensor of claim 11, wherein:
the supporting plate is disposed in the pixel area, and
the supporting plate has a frame shape in the peripheral area and has a mesh shape in the pixel area.

13. The image sensor of claim 12, wherein the supporting plate comprises slits.

14. The image sensor of claim 11, wherein the lower electrode plate and the upper electrode plate comprise a transparent conductor.

15. The image sensor of claim 11, further comprising:
a transparent first protection layer on the microlenses, and
a transparent second protection layer on the light field lenses.

16. An image sensor, comprising:
a substrate having a pixel area and a peripheral area surrounding the pixel area;
first lenses disposed in the pixel area of the substrate;
a supporting plate having a frame shape in the peripheral area of the substrate and having a mesh shape in the pixel area;
lower electrode posts disposed in the peripheral area and on the supporting plate in the pixel area;
a lower electrode plate horizontally disposed on the first lenses and the lower electrode posts;
upper electrode posts disposed on the supporting plate in the peripheral area;
an upper electrode plate horizontally disposed on the lower electrode plate and the upper electrode posts; and
second lenses disposed on the upper electrode plate,
wherein an air gap exists between the first lenses and the lower electrode plate and between the lower electrode plate and the upper electrode plate.

17. The image sensor of claim 16, further comprising holes selectively disposed at locations each hole corresponding to a boundary portion of the four second lenses within the pixel area.

18. The image sensor of claim 17, wherein the lower electrode posts comprise inner lower electrode posts each selectively formed at a location corresponding to a boundary portion of the four light field lenses within the pixel area.

19. The image sensor of claim 18, wherein the holes and the inner lower electrode posts are disposed in such a way as to alternate.

20. The image sensor of claim 16, wherein the supporting plate, the lower electrode posts, the lower electrode plate, the upper electrode posts, and the upper electrode plate comprise a conductor.

\* \* \* \* \*